United States Patent
Park et al.

(10) Patent No.: US 12,448,530 B2
(45) Date of Patent: Oct. 21, 2025

(54) INK COMPOSITION, LIGHT EMITTING DIODE, AND METHOD FOR MANUFACTURING LIGHT EMITTING DIODE

(71) Applicant: Samsung Display Co., Ltd., Yongin-si (KR)

(72) Inventors: Won-Jun Park, Seoul (KR); Sehun Kim, Yongin-si (KR); Jaekook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 568 days.

(21) Appl. No.: 17/745,387

(22) Filed: May 16, 2022

(65) Prior Publication Data

US 2023/0107873 A1    Apr. 6, 2023

(30) Foreign Application Priority Data

Sep. 24, 2021    (KR) .................. 10-2021-0126593

(51) Int. Cl.
| | |
|---|---|
| H01L 51/00 | (2006.01) |
| C09D 5/22 | (2006.01) |
| C09D 11/037 | (2014.01) |
| C09D 11/30 | (2014.01) |
| H10K 71/15 | (2023.01) |
| H10K 50/11 | (2023.01) |
| H10K 71/13 | (2023.01) |
| H10K 101/10 | (2023.01) |

(52) U.S. Cl.
CPC ............ *C09D 11/037* (2013.01); *C09D 5/22* (2013.01); *C09D 11/30* (2013.01); *H10K 71/15* (2023.02); *H10K 50/11* (2023.02); *H10K 71/135* (2023.02); *H10K 2101/10* (2023.02)

(58) Field of Classification Search
CPC .......... C09D 11/037; C09D 5/22; C09D 11/30
See application file for complete search history.

(56) References Cited

U.S. PATENT DOCUMENTS

| | | | |
|---|---|---|---|
| 12,104,068 B2 * | 10/2024 | Oka ..................... | C09D 11/106 |
| 2019/0264053 A1 | 8/2019 | Kim et al. | |
| 2021/0277266 A1 | 9/2021 | Béalle et al. | |
| 2021/0283913 A1 | 9/2021 | Noda et al. | |
| 2022/0204783 A1 * | 6/2022 | Lofftus ................ | C09D 7/70 |
| 2022/0235238 A1 * | 7/2022 | Levermore .......... | C09K 11/664 |
| 2022/0267632 A1 * | 8/2022 | Jee ....................... | B41M 5/0023 |

(Continued)

FOREIGN PATENT DOCUMENTS

| | | |
|---|---|---|
| KR | 10-2018-0130214 | 12/2018 |
| KR | 10-2145655 | 8/2020 |

(Continued)

*Primary Examiner* — Thao P Le
(74) *Attorney, Agent, or Firm* — Lerner David LLP

(57) ABSTRACT

An ink composition including a mixed solvent including a first solvent and a second solvent, and a light emitting material, wherein the first solvent and the second solvent each have a vapor pressure of about $1 \times 10^{-4}$ or greater and a boiling point of about 270° C. or less. The ink composition according to an embodiment may be applied to forming an emission layer of a light emitting diode to provide a light emitting diode having increased efficiency.

13 Claims, 10 Drawing Sheets

(56) References Cited

U.S. PATENT DOCUMENTS

| | | | |
|---|---|---|---|
| 2023/0107873 A1* | 4/2023 | Park ......................... | C09D 5/22 |
| | | | 257/40 |
| 2023/0139873 A1* | 5/2023 | Loi ........................ | H10K 30/87 |
| | | | 438/82 |
| 2024/0316948 A1* | 9/2024 | Kim ....................... | C09D 11/38 |
| 2024/0397743 A1* | 11/2024 | Ueta .................... | H10K 71/135 |

FOREIGN PATENT DOCUMENTS

| KR | 10-2021-0014297 | 2/2021 |
|---|---|---|
| KR | 10-2021-0022046 | 3/2021 |
| KR | 10-2021-0046709 | 4/2021 |

* cited by examiner

INK COMPOSITION, LIGHT EMITTING DIODE, AND METHOD FOR MANUFACTURING LIGHT EMITTING DIODE

CROSS-REFERENCE TO RELATED APPLICATION(S)

This U.S. non-provisional patent application claims priority to and benefits of Korean Patent Application No. 10-2021-0126593 under 35 U.S.C. § 119, filed on Sep. 24, 2021 in the Korean Intellectual Property Office (KIPO), the entire contents of which are hereby incorporated by reference.

BACKGROUND

1. Technical Field

The disclosure relates to a light emitting diode including an emission layer containing a crosslinked polymer, a display device including the same, and a method for manufacturing the light emitting diode.

2. Description of the Related Art

Various types of display devices used for multimedia devices such as a television set, a mobile phone, a tablet computer, a navigation system, and a game console are being developed. In such display devices, a so-called self-luminescent light emitting diode may be used which accomplishes display by causing an organic compound-containing light emitting material to emit light.

In the manufacture of light emitting diodes, a manufacturing method such as an inkjet printing method may be used.

SUMMARY

The disclosure provides a light emitting diode having increased luminous efficiency and lifespan by including an ink composition containing low boiling point solvents and an emission layer formed of the ink composition.

The disclosure also provides a method for manufacturing a light emitting diode including forming an emission layer having increased efficiency of a drying process by including low boiling point solvents.

An embodiment of the disclosure provides an ink composition that may include a mixed solvent including a first solvent and a second solvent, and a light emitting material. The first solvent and the second solvent each may have a vapor pressure of about $1 \times 10^{-4}$ or greater and a boiling point of about 270° C. or less.

In an embodiment, the mixed solvent may have a relative evaporation rate of about 30,000 or less.

In an embodiment, the mixed solvent may have a δD of about 20 or less and a δP of about 4 or greater in terms of Hansen parameters.

In an embodiment, the first solvent may be an aromatic solvent.

In an embodiment, the second solvent may be an ether-based solvent.

In an embodiment, the first solvent and the second solvent may be included in a ratio of about 8:2 to about 6:4.

In an embodiment, the mixed solvent may have an evaporation completion temperature of about 150° C. or less.

In an embodiment, the light emitting material may be included in an amount of about 0.5 to about 15 parts by weight with respect to 100 parts by weight of the mixed solvent.

In an embodiment, the light emitting material may include a host compound and a dopant compound.

In an embodiment of the disclosure, a light emitting diode may include a first electrode, a hole transport region disposed on the first electrode, an emission layer disposed on the hole transport region and including a mixed solvent including a first solvent and a second solvent, and a light emitting material, and a second electrode disposed on the emission layer. The first solvent and the second solvent each may have a vapor pressure of about $1 \times 10^{-4}$ or greater and a boiling point of about 270° C. or less.

In an embodiment, the mixed solvent may have a relative evaporation rate of about 30,000 or less.

In an embodiment, the mixed solvent may have a δD of about 20 or less and a δP of about 4 or greater in terms of Hansen parameters.

In an embodiment, the hole transport region may include a hole transport compound, and the hole transport compound may have a δD of greater than about 20 and a δP of less than about 4 in terms of Hansen parameters.

In an embodiment, the light emitting diode may further include a capping layer disposed on the second electrode, wherein the capping layer may have a refractive index of about 1.6 or greater.

In an embodiment of the disclosure, a method for manufacturing a light emitting diode may include providing a first electrode, forming a hole transport region on the first electrode, providing an ink composition on the hole transport region to form an emission layer, and forming a second electrode on the emission layer. The ink composition may include a mixed solvent including a first solvent and a second solvent, and a light emitting material. The first solvent and the second solvent may each have a vapor pressure of about $1 \times 10^{-4}$ or greater and a boiling point of about 270° C. or less.

In an embodiment, the mixed solvent may have a δD of about 20 or less and a δP of about 4 or greater in terms of Hansen parameters.

In an embodiment, the forming of the emission layer may include providing the ink composition through inkjet printing.

In an embodiment, the forming of the emission layer may include providing the ink composition to form a preliminary emission layer, and providing heat to the preliminary emission layer.

In an embodiment, the providing of heat to the preliminary emission layer may be performed at about 160° C. or less.

In an embodiment, the light emitting material may be included in an amount of about 0.5 to about 15 parts by weight with respect to 100 parts by weight of the mixed solvent.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
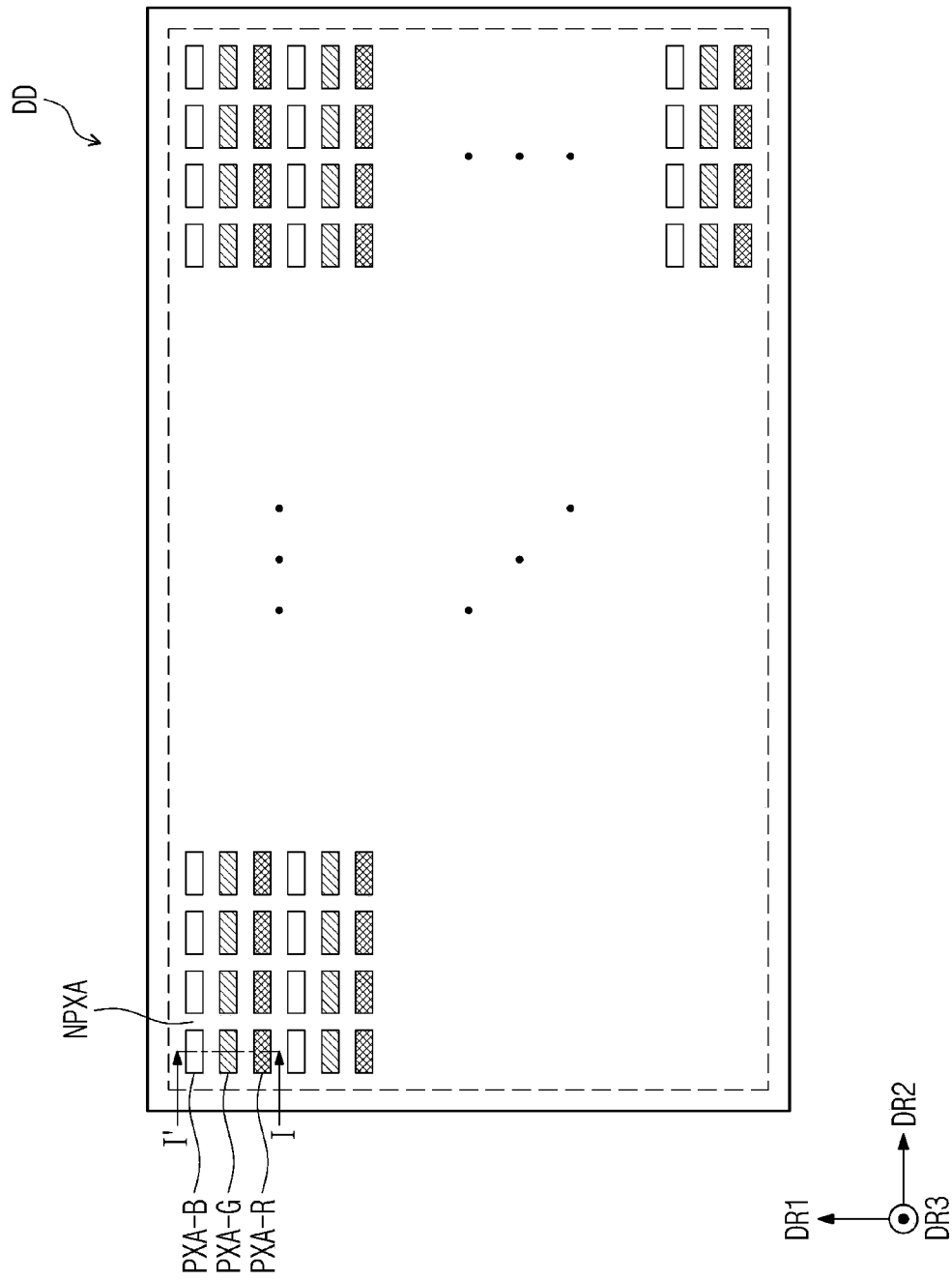
FIG. 1 is a plan view schematically showing a display device according to an embodiment of the disclosure.

The disclosure may be modified in many alternate forms, and thus specific embodiments will be provided only as examples in the drawings and detailed description. It should be understood, however, that these embodiments are not intended to limit the disclosure to the particular forms disclosed, but rather, the disclosure is intended to include in its spirit and scope all modifications, equivalents, and alternatives.

In the description, when an element (or a region, a layer, a portion, etc.) is referred to as being "on," "connected to," or "coupled to" another element, it means that the element may be directly disposed on/connected to/coupled to the other element, or that a third element may be disposed therebetween.

In the description, "directly disposed" may indicate that there is no layer, film, region, plate or the like added between a portion of a layer, a film, a region, a plate or the like and other portions. For example, "directly disposed" may indicate disposing without additional members such as an adhesive member between two layers or two members.

Like reference numerals refer to like elements. In the drawings, the thickness, the ratio, and the dimensions of elements may be exaggerated for an effective description of technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the disclosure. The singular forms are intended to include the plural forms as well, unless the context clearly indicates otherwise.

Terms such as "below", "lower", "above", "upper", and the like may be used to describe the relationships of the components illustrated in the drawings. The terms are used as a relative concept and are described with reference to a direction indicated in the drawings.

It should be understood that the terms "comprise", "include", "have", or the like are intended to specify the presence of stated features, integers, steps, operations, elements, components, or combinations thereof in the disclosure, but do not preclude the presence or addition of one or more other features, integers, steps, operations, elements, components, or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
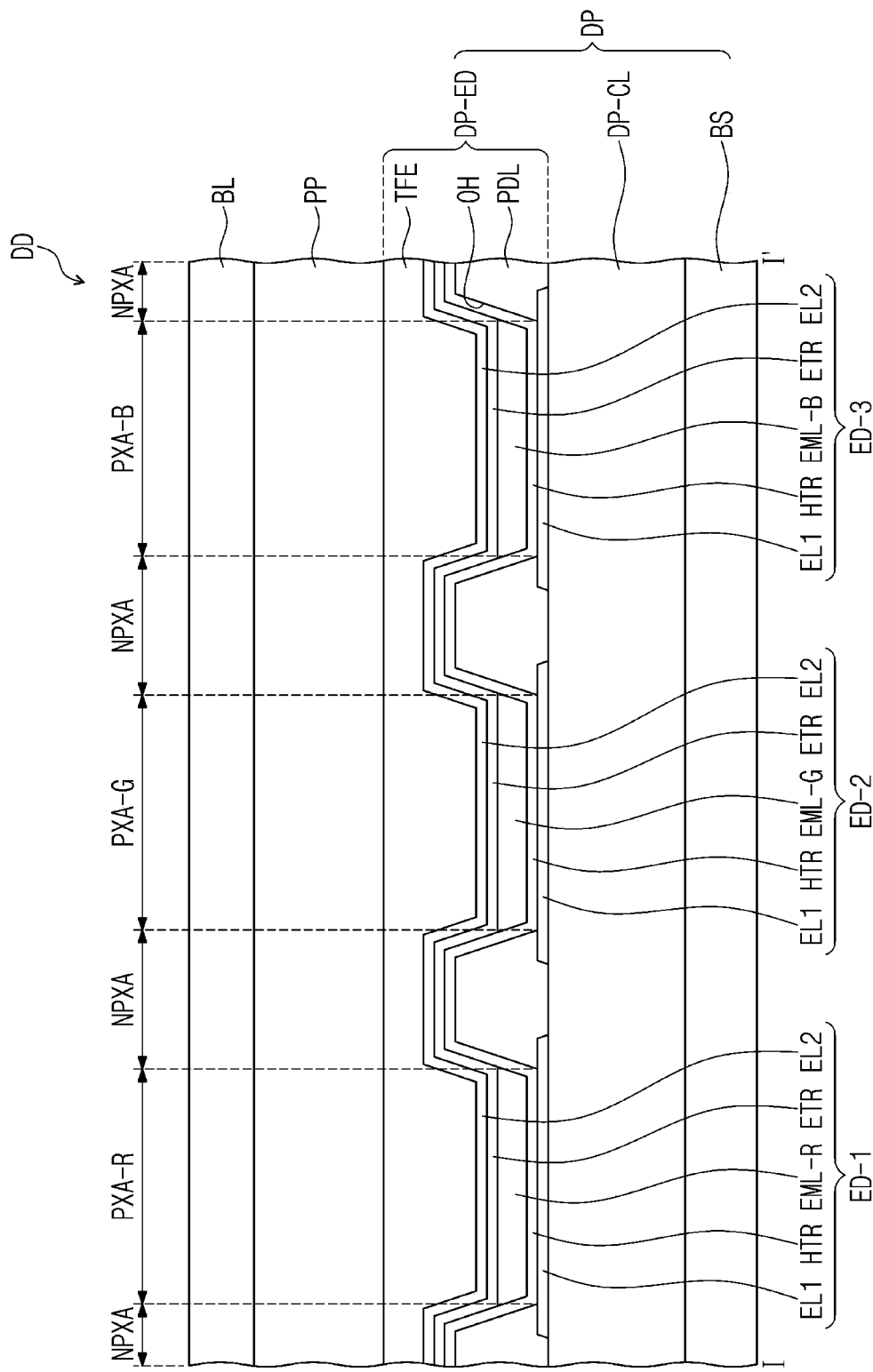
FIG. 2 is a cross-sectional view schematically showing a display device according to an embodiment of the disclosure.

FIG. 1 is a plan view schematically showing an embodiment of a display device DD according to an embodiment of the disclosure. FIG. 2 is a cross-sectional view schematically showing a display device DD according to an embodiment of the disclosure. FIG. 2 is a cross-sectional view showing a portion corresponding to line I-I' of FIG. 1.

The display device DD may include a display panel DP and an optical layer PP disposed on the display panel DP. The display panel DP may include light emitting diodes ED-1, ED-2, and ED-3. The optical layer PP may be disposed on the display panel DP to control reflected light in the display panel DP due to external light. The optical layer PP may include, for example, a polarizing layer or a color filter layer. Unlike what is shown in the drawings, the optical layer PP may be omitted in the display device DD of an embodiment.

A base substrate BL may be disposed on the optical layer PP. The base substrate BL may be a member providing a base surface on which the optical layer PP is disposed. The base substrate BL may be a glass substrate, a metal substrate, a plastic substrate, and the like, or a combination thereof. However, embodiments of the disclosure are not limited thereto, and the base substrate BL may be an inorganic layer, an organic layer, a composite material layer, or a combination thereof. Unlike what is shown, the base substrate BL may be omitted in an embodiment.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic resin, a silicone-based resin, and an epoxy-based resin.

The display panel DP may include a base layer BS, a circuit layer DP-CL provided on the base layer BS, and a display element layer DP-ED. The display element layer DP-ED may include pixel defining films PDL, light emitting diodes ED-1, ED-2, and ED-3 disposed between the pixel defining films PDL, and an encapsulation layer TFE disposed on the light emitting diodes ED-1, ED-2, and ED-3.

The base layer BS may be a member providing a base surface in which the display element layer DP-ED is disposed. The base layer BS may be a glass substrate, a metal substrate, a plastic substrate, or the like, or a combination thereof. However, embodiments of the disclosure are not limited thereto, and the base layer BS may be an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the light emitting diodes ED-1, ED-2 and ED-3 of the display element layer DP-ED.

The light emitting diodes ED-1, ED-2, and ED-3 may each have a structure of a light emitting diode ED of an embodiment according to FIGS. 3 to 6, which will be described later. The light emitting diodes ED-1, ED-2, and ED-3 may each include a first electrode EL1, a hole transport region HTR, emission layers EML-R, EML-G, and EML-B, an electron transport region ETR, and a second electrode EL2.

FIG. 2 shows an embodiment in which the emission layers EML-R, EML-G, and EML-B of the light emitting diodes ED-1, ED-2, and ED-3 are disposed in openings OH defined in the pixel defining films PDL, and the hole transport region HTR, the electron transport region ETR, and the second electrode EL2 are provided as a common layer throughout the light emitting diodes ED-1, ED-2, and ED-3. However, embodiments of the disclosure are not limited thereto, and unlike what is shown in FIG. 2, in an embodiment, the hole transport region HTR and the electron transport region ETR may be provided to be patterned inside the openings OH defined in the pixel defining films PDL. For example, in an embodiment, the hole transport region HTR, the emission layers EML-R, EML-G, and EML-B, the electron transport region ETR, etc., of the light emitting diodes ED-1, ED-2, and ED-3 may be patterned and provided through an inkjet printing method.

The encapsulation layer TFE may cover the light emitting diodes ED-1, ED-2 and ED-3. The encapsulation layer TFE may seal the display element layer DP-ED. The encapsulation layer TFE may be a thin film encapsulation layer. The encapsulation layer TFE may be a single layer or a laminated layer of multiple layers. The encapsulation layer TFE may include at least one insulating layer. The encapsulation layer TFE according to an embodiment may include at least one inorganic film (hereinafter, an encapsulation inorganic film). The encapsulation layer TFE according to an embodiment may include at least one organic film (hereinafter, an encapsulation organic film) and at least one encapsulation inorganic film.

The encapsulation inorganic film may protect the display element layer DP-ED from moisture/oxygen, and the encapsulation organic film protects the display element layer DP-ED from foreign substances such as dust particles. The encapsulation inorganic film may include silicon nitride, silicon oxy nitride, silicon oxide, titanium oxide, aluminum oxide, etc., but is not particularly limited thereto. The encapsulation organic layer may include an acrylic compound, an epoxy-based compound, etc. The encapsulation organic layer may include a photopolymerizable organic material, and is not particularly limited.

The encapsulation layer TFE may be disposed on the second electrode EL2, and may be disposed to fill the openings OH.

Referring to FIGS. 1 and 2, the display device DD may include non-light emitting regions NPXA and light emitting regions PXA-R, PXA-G, and PXA-B. The light emitting regions PXA-R, PXA-G, and PXA-B may each be a region emitting light generated from each of the light emitting diodes ED-1, ED-2, and ED-3. The light emitting regions PXA-R, PXA-G, and PXA-B may be spaced apart from each other on a plane.

The light emitting regions PXA-R, PXA-G, and PXA-B may each be a region separated by the pixel defining films PDL. The non-light emitting regions NPXA may be regions between neighboring light emitting regions PXA-R, PXA-G, and PXA-B, and may correspond to the pixel defining films PDL. In the description, each of the light emitting regions PXA-R, PXA-G, and PXA-B may correspond to a pixel. The pixel defining films PDL may separate the light emitting diodes ED-1, ED-2 and ED-3. The emission layers EML-R, EML-G, and EML-B of the light emitting diodes ED-1, ED-2 and ED-3 may be disposed and separated in openings OH defined by the pixel defining films PDL.

The light emitting regions PXA-R, PXA-G, and PXA-B may be divided into groups according to the color of light generated from the light emitting diodes ED-1, ED-2, and ED-3. In the display device DD of an embodiment shown in FIGS. 1 and 2, three light emitting regions PXA-R, PXA-G, and PXA-B which may emit red light, green light, and blue light, are illustrated as an example. For example, the display device DD of an embodiment may include a red light emitting region PXA-R, a green light emitting region PXA-G, and a blue light emitting region PXA-B, which may be distinct from one another.

In the display device DD according to an embodiment, the light emitting diodes ED-1, ED-2, and ED-3 may emit light having different wavelength ranges. For example, in an embodiment, the display device DD may include a first light emitting diode ED-1 emitting red light, a second light emitting diode ED-2 emitting green light, and a third light emitting diode ED-3 emitting blue light. For example, the red light emitting region PXA-R, the green light emitting region PXA-G, and the blue light emitting region PXA-B of the display device DD may correspond to the first light emitting diode ED-1, the second light emitting diode ED-2, and the third light emitting diode ED-3, respectively.

However, embodiments of the disclosure are not limited thereto, and the first to third light emitting diodes ED-1, ED-2 and ED-3 may emit light in the same wavelength range or emit light in at least one different wavelength range. For example, the first to third light emitting diodes ED-1, ED-2, and ED-3 may all emit blue light.

The light emitting regions PXA-R, PXA-G, and PXA-B in the display device DD according to an embodiment may be arranged in the form of a stripe. Referring to FIG. 1, red light emitting regions PXA-R, green light emitting regions PXA-G, and blue light emitting regions PXA-B may each be arranged along a second directional axis DR2. In other embodiments, the red light emitting region PXA-R, the green light emitting region PXA-G, and the blue light emitting region PXA-B may be alternately arranged in turn along a first directional axis DR1.

FIGS. 1 and 2 illustrate that the light emitting regions PXA-R, PXA-G, and PXA-B are all similar in size, but embodiments of the disclosure are not limited thereto, and the light emitting regions PXA-R, PXA-G and PXA-B may be different in size from each other according to wavelength range of emitted light. The areas of the light emitting regions PXA-R, PXA-G, and PXA-B may refer to an area when viewed on a plane defined by the first directional axis DR1 and the second directional axis DR2.

The arrangement of the light emitting regions PXA-R, PXA-G, and PXA-B is not limited to the one shown in FIG. 1, and the order in which the red light emitting region PXA-R, the green light emitting region PXA-G, and the blue light emitting region PXA-B are arranged comes with varied combination according to display quality characteristics required for the display device DD. For example, the light emitting regions PXA-R, PXA-G, and PXA-B may be arranged in the form of a PenTile® or a diamond.

An area of each of the light emitting regions PXA-R, PXA-G, and PXA-B may be different in size from one another. For example, in an embodiment, the green light emitting region PXA-G may be smaller than the blue light emitting region PXA-B in size, but embodiments of the disclosure are not limited thereto.

Hereinafter, FIGS. 3 to 6 are cross-sectional views schematically showing a light emitting diode according to an embodiment of the disclosure. The light emitting diode ED according to an embodiment may include a first electrode ELL a hole transport region HTR, an emission layer EML, an electron transport region ETR, and a second electrode EL2.

Figure 3:
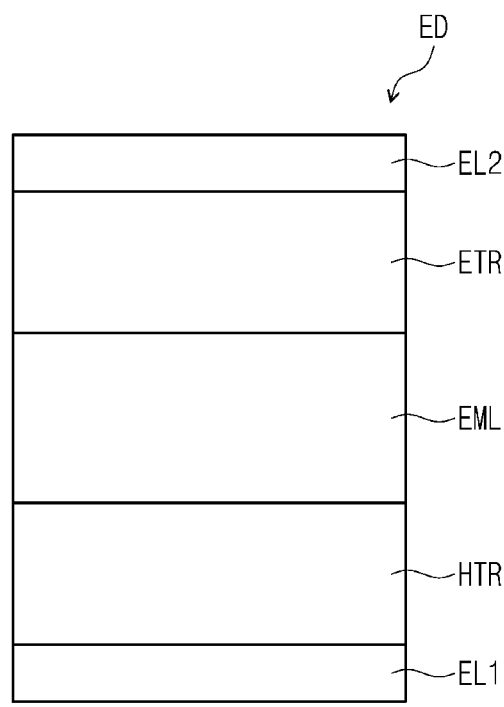
FIG. 3 is a cross-sectional view schematically showing a light emitting diode according to an embodiment of the disclosure.
Figure 4:
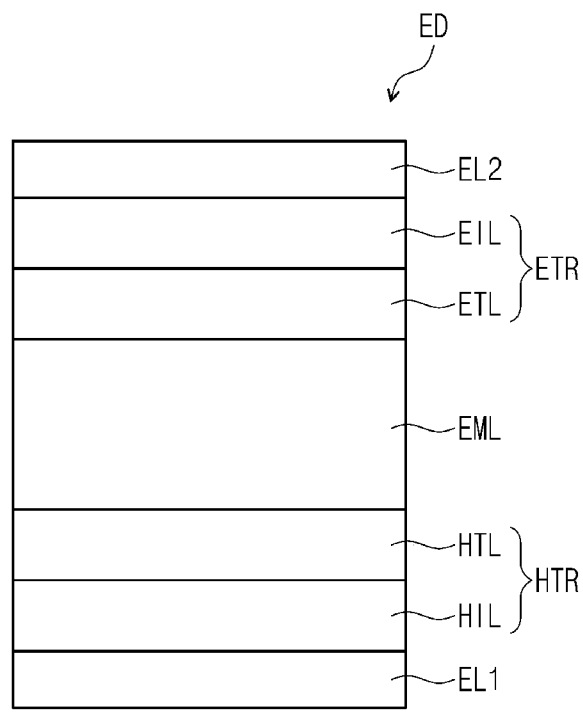
FIG. 4 is a cross-sectional view schematically showing a light emitting diode according to an embodiment of the disclosure.
Figure 5:
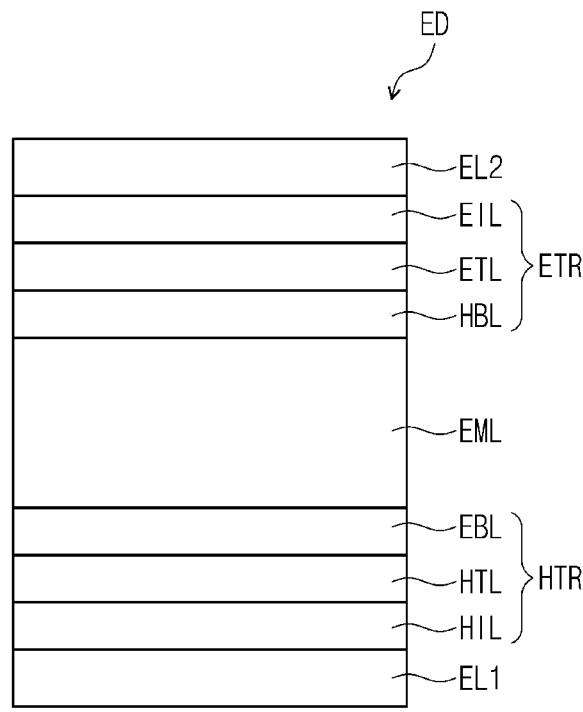
FIG. 5 is a cross-sectional view schematically showing a light emitting diode according to an embodiment of the disclosure.
Figure 6:
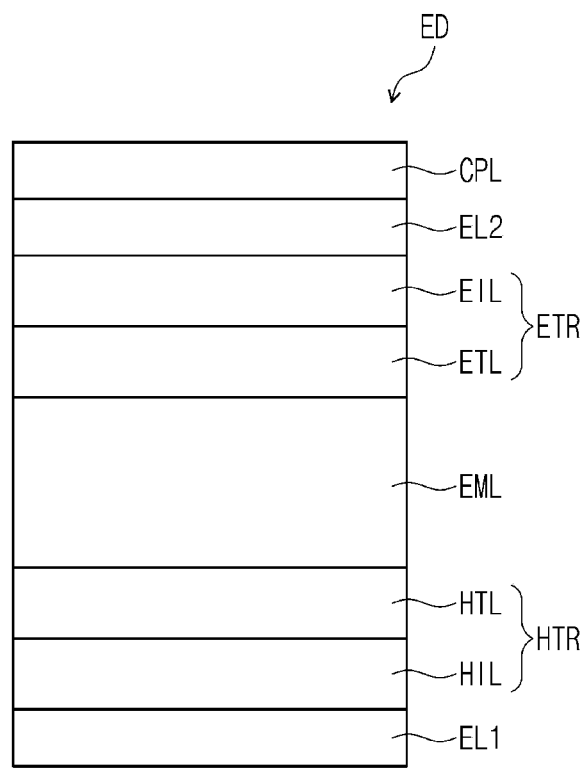
FIG. 6 is a cross-sectional view schematically showing a light emitting diode according to an embodiment of the disclosure.

FIG. 4 shows, compared with FIG. 3, a cross-sectional view of a light emitting diode ED of an embodiment in which the hole transport region HTR may include a hole injection layer HIL and a hole transport layer HTL, and the electron transport region ETR includes an electron injection layer EIL and an electron transport layer ETL. FIG. 5 shows, compared with FIG. 3, a cross-sectional view of a light emitting diode ED of an embodiment in which the hole transport region HTR may include a hole injection layer HIL, a hole transport layer HTL, and an electron blocking layer EBL, and the electron transport region ETR may include an electron injection layer EIL, an electron transport layer ETL, and a hole blocking layer HBL. FIG. 6 shows, compared with FIG. 4, a cross-sectional view of a light emitting diode ED of an embodiment, in which a capping layer CPL disposed on the second electrode EL2 may be provided.

The first electrode EL1 may have conductivity. The first electrode EL1 may be formed of a metal material, a metal alloy or a conductive compound. The first electrode EL1 may be an anode or a cathode. However, embodiments of the disclosure are not limited thereto. The first electrode EL1 may be a pixel electrode. The first electrode EL1 may be a transmissive electrode, a transflective electrode, or a reflective electrode. In case that the first electrode EL1 is the transmissive electrode, the first electrode EL1 may include a transparent metal oxide such as indium tin oxide (ITO), indium zinc oxide (IZO), zinc oxide (ZnO), indium tin zinc oxide (ITZO), or a combination thereof. In case that the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In other embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc., or a combination thereof. For example, the first electrode EL1 may have a three-layer structure of ITO/Ag/ITO, but is not limited thereto. Embodiments of the disclosure are not limited thereto, and the first electrode EL1 may include the above-described metal materials, a combination of two or more metal materials selected from the above-described metal materials, or oxides of the above-described metal materials. The first electrode EL1 may have a thickness of about 700 Å to about 10000 Å. For example, the first electrode EL1 may have a thickness of 1000 Å to about 3000 Å.

The hole transport region HTR may be provided on the first electrode EL1. The hole transport region HTR may include at least one among a hole injection layer HIL, a hole transport layer HTL, a buffer layer, a light emitting auxiliary layer (not shown), and an electron blocking layer EBL. The hole transport region HTR may have, for example, a thickness of about 50 Å to about 15000 Å.

The hole transport region HTR may have a single layer formed of a single material, a single layer formed of different materials, or a multilayer structure having multiple layers formed of different materials.

For example, the hole transport region HTR may have a single-layer structure formed of the hole injection layer HIL or the hole transport layer HTL, or a single-layer structure formed of a hole injection material or a hole transport material. For example, the hole transport region HTR may have a single-layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL may be stacked in order from the first electrode EL1, but embodiments of the disclosure are not limited thereto.

The hole transport region HTR may be formed using various methods such as a vacuum deposition method, a spin coating method, a cast method, a Langmuir-Blodgett (LB) method, an inkjet printing method, a laser printing method, a laser induced thermal imaging (LITI) method, or a combination thereof.

The hole transport region HTR may include a hole transport compound. The hole transport compound may have a δD of greater than about 20 and a δP of less than about 4 in terms of Hansen parameters. δD may indicate a parameter related to Dispersion Forces, and δP may indicate a parameter related to Dipol-dipol Forces.

For example, the hole transport compound may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc., or a combination thereof.

The hole transport region HTR may include carbazole-based derivatives such as N-phenyl carbazole and polyvinyl carbazole, fluorene-based derivatives, N,N'-bis(3-methylphenyl)-N,N-diphenyl-[1,1-biphenyl]-4,4'-diamine (TPD), triphenylamine-based derivatives such as 4,4',4'-tris (N-carbazolyl)triphenylamine (TCTA), N,N'-di(1-naphtalene-1-yl)-N,N-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc., or a combination thereof.

The hole transport compound may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc., or a combination thereof.

The hole transport region HTR may include the hole transport compounds described above in at least one of the hole injection layer HIL, the hole transport layer HTL, and the electron blocking layer EBL.

The hole transport region HTR may have a thickness of about 100 Å to about 10000 Å, for example, about 100 Å to about 5000 Å. In case that the hole transport region HTR includes the hole injection layer HIL, the hole injection layer HIL may have a thickness of, for example, about 30 Å to about 1000 Å. In case that the hole transport region HTR includes the hole transport layer HTL, the hole transport layer HTL may have a thickness of about 30 Å to about 1000 Å. In case that the hole transport region HTR includes the electron blocking layer EBL, the electron blocking layer EBL may have a thickness of, for example, about 10 Å to about 1000 Å. In case that the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, and cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., or a combination thereof, but is not limited thereto.

As described above, the hole transport region HTR may further include at least one of a buffer layer (not shown) or an electron blocking layer EBL in addition to the hole injection layer HIL and the hole transport layer HTL. The buffer layer (not shown) may compensate a resonance distance according to wavelengths of light emitted from an emission layer EML, and may thus increase luminous efficiency. Materials which may be included in the hole transport region HTR may be used as materials included in the buffer layer (not shown). The electron blocking layer EBL may be a layer that serves to prevent electrons from being injected from the electron transport region ETR to the hole transport region HTR.

The emission layer EML may be provided on the hole transport region HTR. The emission layer EML may have, for example, a thickness of about 100 Å to about 1000 Å, or about 100 Å to about 300 Å. The emission layer EML may have a single layer formed of a single material, a single layer formed of different materials, or a multilayer structure having multiple layers formed of different materials.

In an embodiment, the emission layer EML may include an ink composition according to an embodiment. For example, the emission layer EML may be formed of the ink composition according to an embodiment. The ink composition according to an embodiment may include a mixed solvent containing a first solvent and a second solvent, and a light emitting material, The first solvent and the second solvent included in the mixed solvent may each satisfy conditions of having a vapor pressure (V.P) of about $1\times10^{-4}$ or greater and a boiling point (B.P) of about 270° C. or less. In case that the first solvent and the second solvent included in the mixed solvent do not each satisfy the above conditions, the first solvent or the second solvent may remain in the process of forming the emission layer EML, and the forming of the emission layer EML may slow down, thereby causing an issue in the process.

In an embodiment, the mixed solvent may have a δD of about 20 or less in terms of Hansen parameters. The mixed solvent may have a δP of about 4 or greater in terms of Hansen parameters. In case that the mixed solvent satisfies the Hansen parameters within the above range, orthogonality between the emission layer EML formed of the ink composition according to an embodiment and the hole transport region HTR may be secured, thereby preventing materials forming the emission layer EML and the hole transport region HTR from being mixed with each other. δD may indicate a parameter related to Dispersion Forces, and δP may indicate a parameter related to Dipol-dipol Forces.

The mixed solvent may have a relative evaporation rate (RER) of about 30,000 or less. The relative evaporation rate (RER) herein may be the ratio of the time taken to evaporate a test solvent to the time taken to evaporate a reference solvent under identical conditions. In an embodiment, the reference solvent is diethyl ether, and the relative evaporation rate (RER) of diethyl ether may be about 1. However, the reference solvent is not limited thereto.

In case that the relative evaporation rate (RER) of the test solvent is higher, the test solvent may be evaporated at a slower rate than the reference solvent. Each solvent may have its own relative evaporation rate (RER). The evaporation rate of a specific solvent may be projected through the relative evaporation rate (RER).

The relative evaporation rate (RER) of the mixed solvent may vary depending on the molecular weight (g/mol) and amount of the first solvent and the second solvent.

The mixed solvent according to an embodiment may have an evaporation completion temperature of about 150° C. or less. In an embodiment, the mixed solvent may have an evaporation completion temperature of about 130° C. or less. The vapor pressure, boiling point, and relative evaporation rate of the mixed solvent herein may all be controlled together, and thus, the temperature at which evaporation may be completed may be lowered and the time for drying may be shortened. The evaporation completion temperature may refer to a temperature at which evaporation reaches about 95% or greater in case that a solvent is evaporated while raising the temperature.

In an embodiment, the first solvent may be an aromatic solvent. The first solvent may include a benzene ring. For example, the first solvent may be isobutyl benzoate, isoamylbenzoate, methylbenzoate, cyclohexylbenzene, isobutyl benzoate, or a combination thereof. However, embodiments of the disclosure are not limited thereto.

In an embodiment, the second solvent may be an ether-based solvent. For example, the second solvent may be diphenyl ether or propylene glycol 1-monophenyl ether. However, embodiments of the disclosure are not limited thereto.

In the mixed solvent of an embodiment, the first solvent and the second solvent may be included in a ratio of about 8:2 to about 6:4. In case that the above range is satisfied, orthogonality between the emission layer EML and the hole transport region HTR may be enhanced, and thus the formed emission layer may have increased efficiency and lifespan.

The ink composition according to an embodiment may include a light emitting material. The light emitting material may have a certain level of solubility in the mixed solvent. In the ink composition of an embodiment, the light emitting material may be included in an amount of about 0.5 parts by weight to about 15 parts by weight with respect to 100 parts by weight of the mixed solvent.

The type of compound included in the light emitting material may vary according to desired light emission wavelength range. The light emitting material may include a host compound and a dopant compound. The light emitting material of an embodiment may include an anthracene derivative, a pyrene derivative, a fluoranthene derivative, a chrysene derivative, a dihydrobenzanthracene derivative, a triphenylene derivative, or a combination thereof. To be specific, the light emitting material may include an anthracene derivative or a pyrene derivative.

The emission layer EML may include a compound represented by Formula E-1 below as a light emitting material of an embodiment. The compound represented by Formula E-1 below may be used as a fluorescent host material.

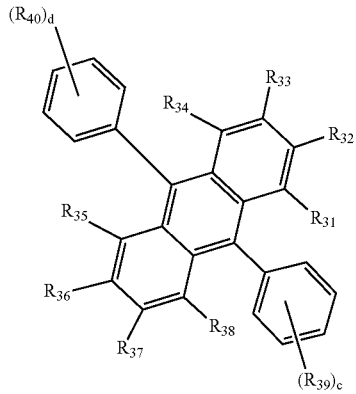

[Formula E-1]

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. $R_{31}$ to $R_{40}$ may be bonded to an adjacent group to form a saturated hydrocarbon ring or unsaturated hydrocarbon ring.

In Formula E-1, c and d may each independently be an integer of 0 to 5.

Formula E-1 may be represented by any one among compounds E1 to E19 below.

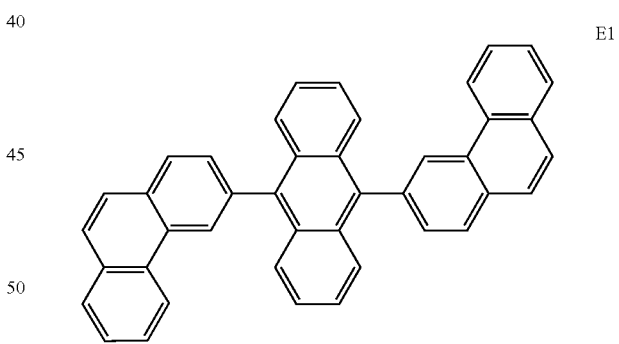

E1

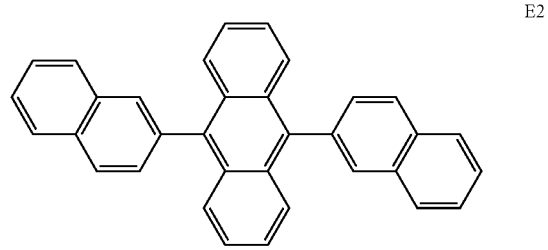

E2

E3
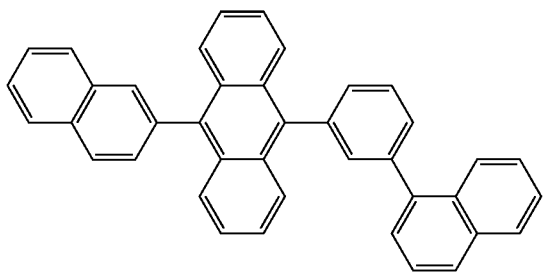
E4
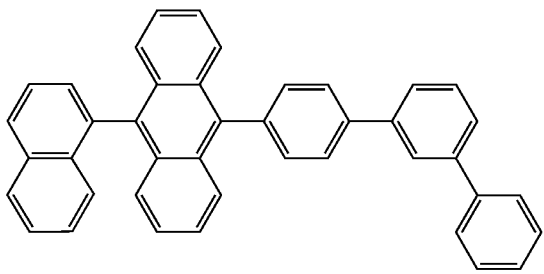
E5
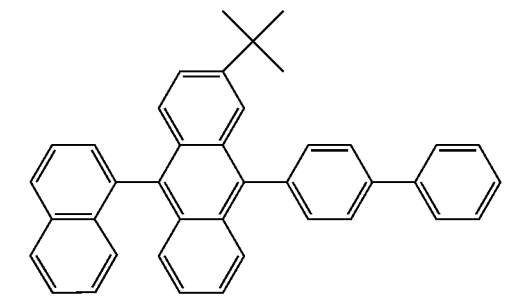
E6
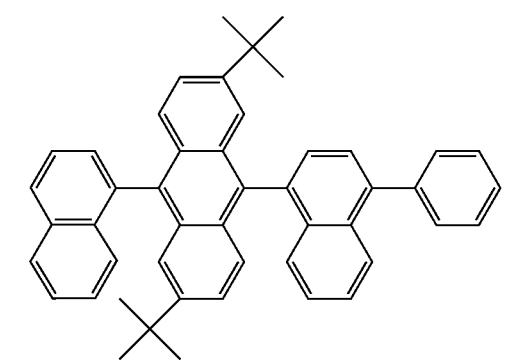
E7
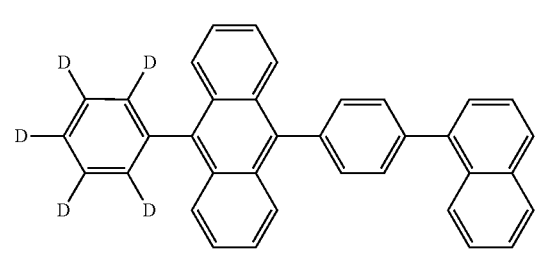
E8
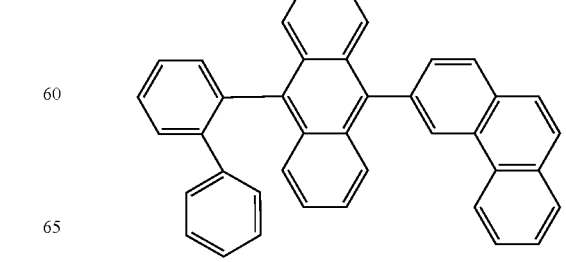
E9
E10
E11
E12

E13
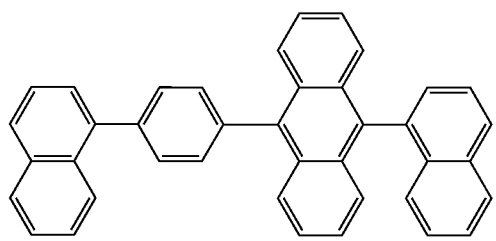
E14
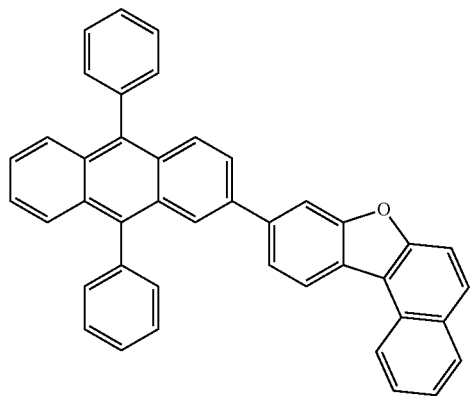
E15
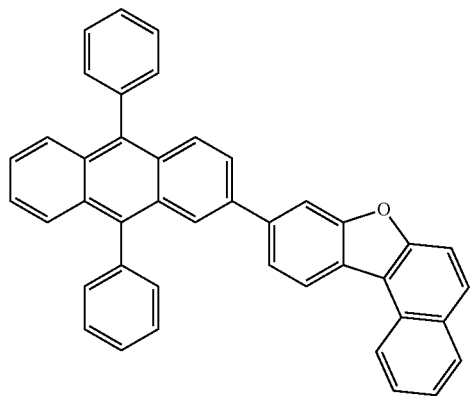
E16
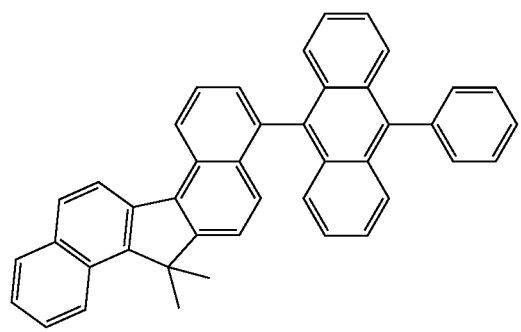
E17
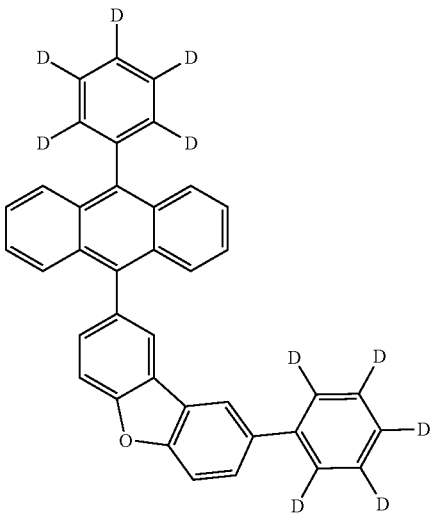
E18
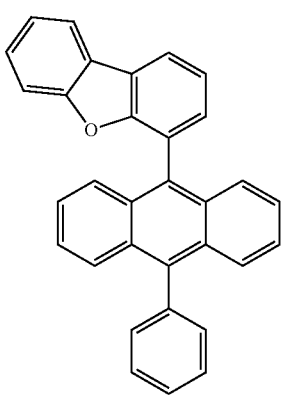
E19
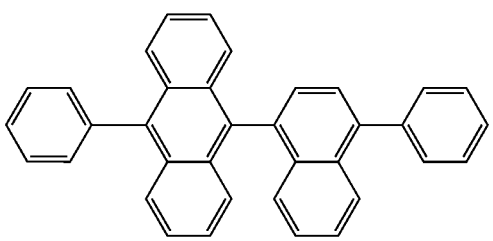
In an embodiment, the emission layer EML may further include a compound represented by Formula E-2a or Formula E-2b below. The compound represented by Formula E-2a or Formula E-2b may be used as a phosphorescent host material.

[Formula E-2a]

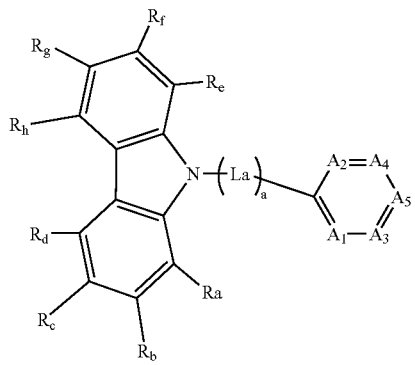

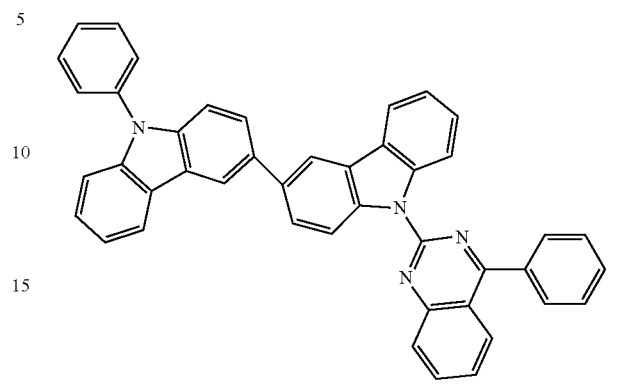

[Compound Group E-2]

E-2-1

In Formula E-2a, a may be an integer of 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In case that a is an integer of 2 or greater, multiple $L_a$'s may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may be N or $Cr_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three selected from $A_1$ to $A_5$ may be N, and the rest may be $Cr_i$.

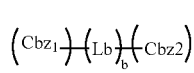

[Formula E-2b]

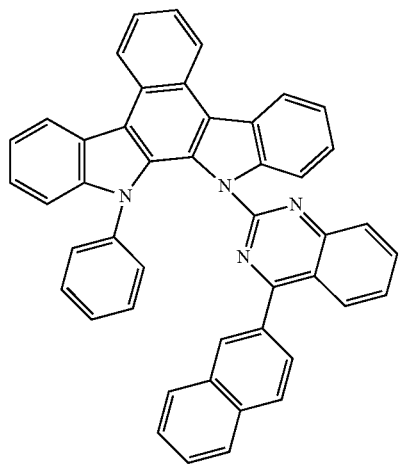

E-2-2

In Formula E-2b, Cbz1 and Cbz2 may each independently be an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms, b may be an integer of 0 to 10, and in case that b is an integer of 2 or greater, multiple $L_b$'s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one of compounds from Compound Group E-2 below. However, the compounds listed in Compound Group E-2 below are presented as an example, and the compound represented by Formula E-2a or Formula E-2b is not limited to those listed in Compound Group E-2 below.

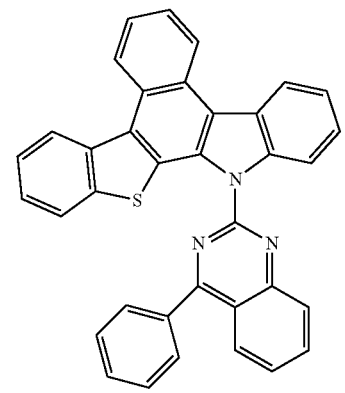

E-2-3

E-2-4
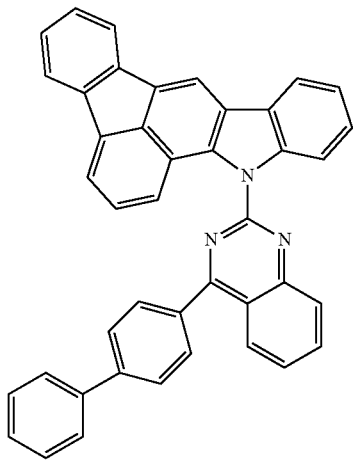
E-2-5
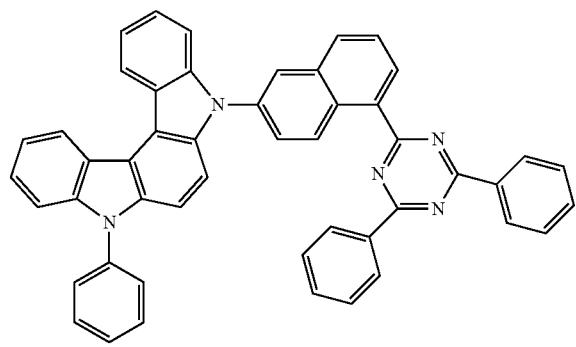
E-2-6
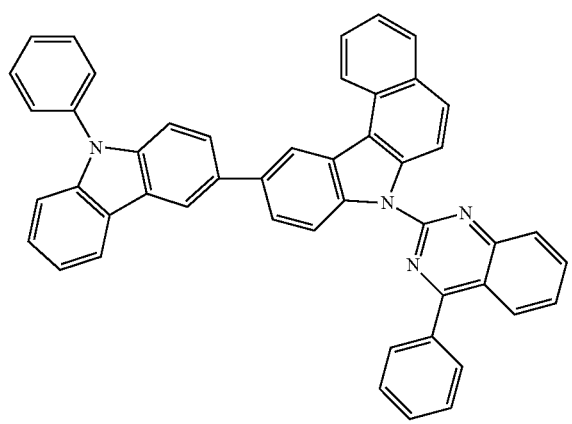
E-2-7
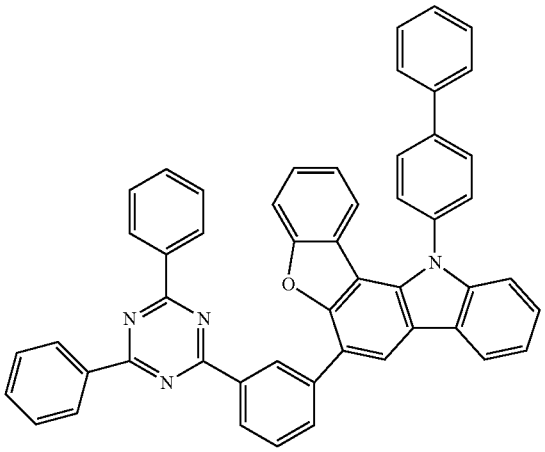
E-2-8
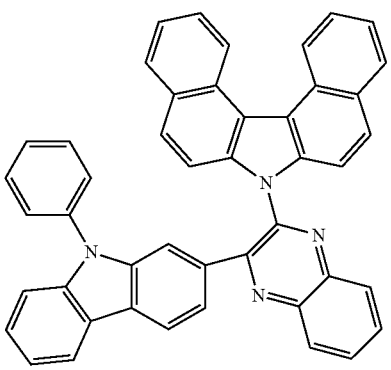
E-2-9
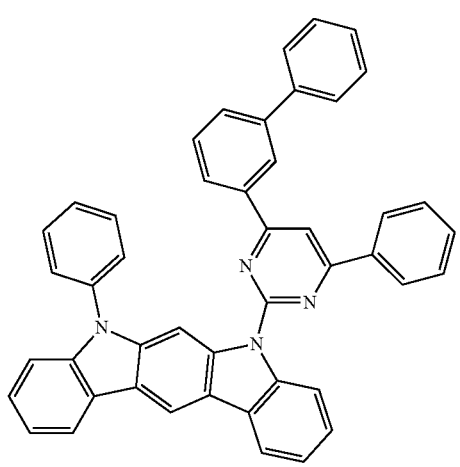

E-2-10
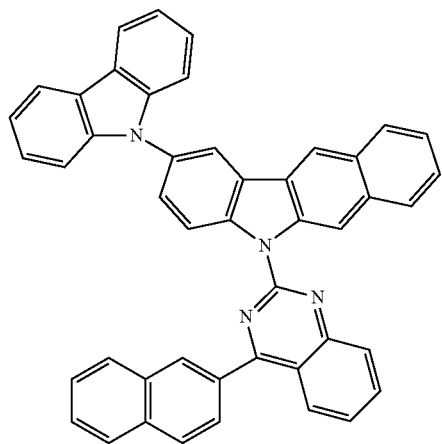
E-2-11
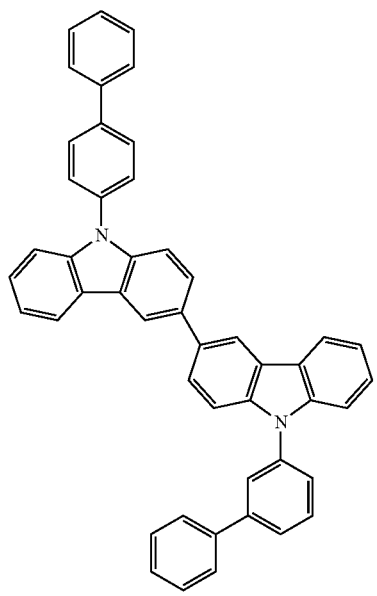
E-2-12
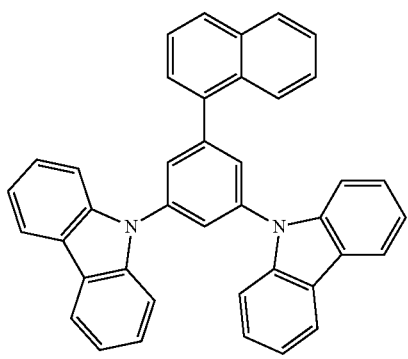
E-2-13
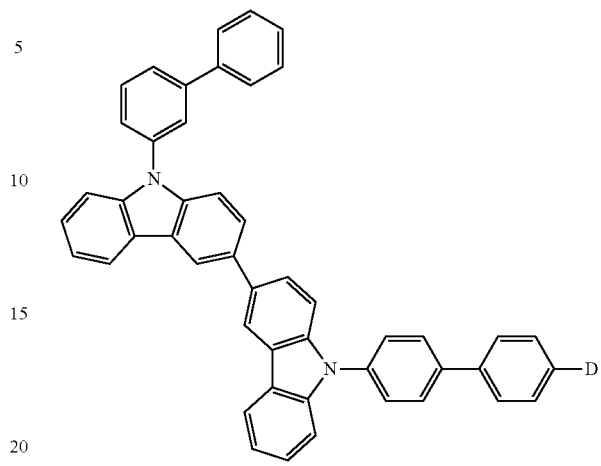
E-2-14
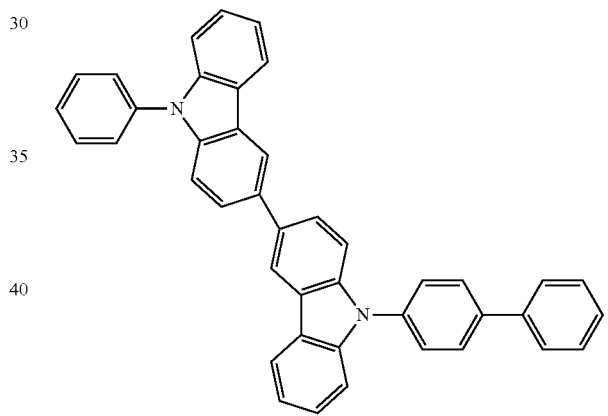
E-2-15
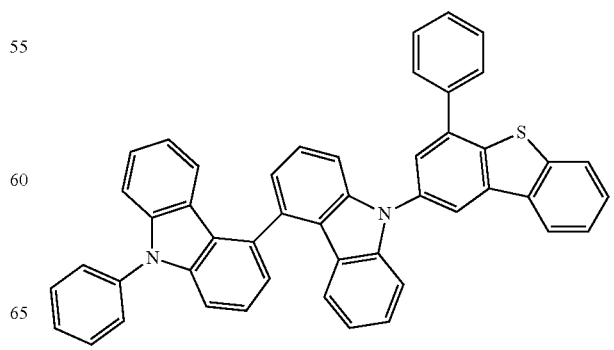

E-2-16
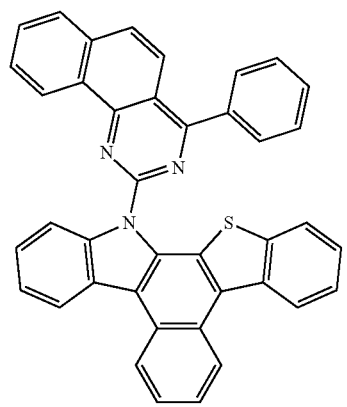
E-2-17
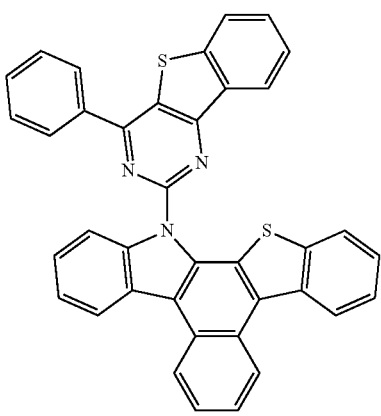
E-2-18
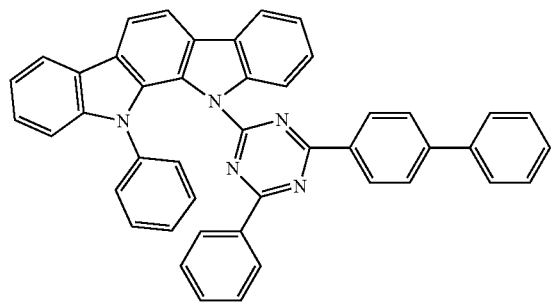
E-2-19
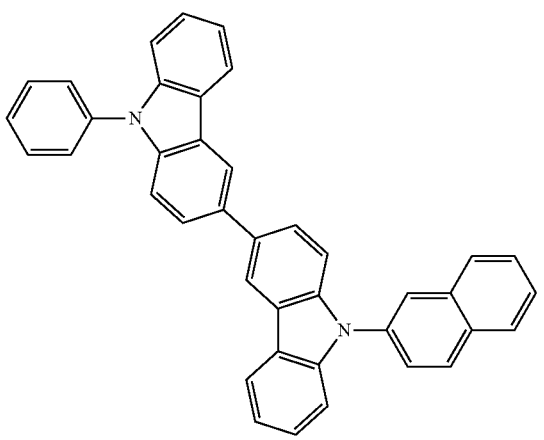
E-2-20
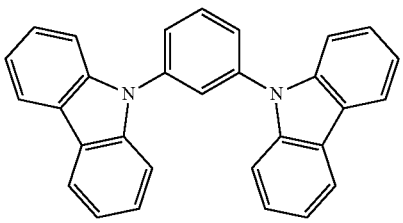
E-2-21
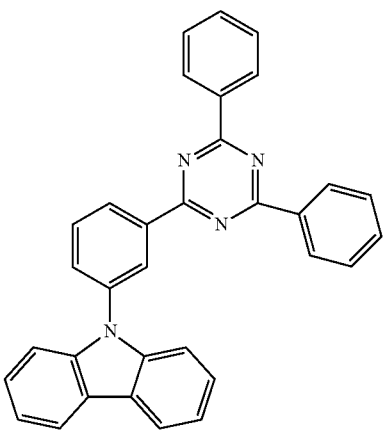
E-2-22
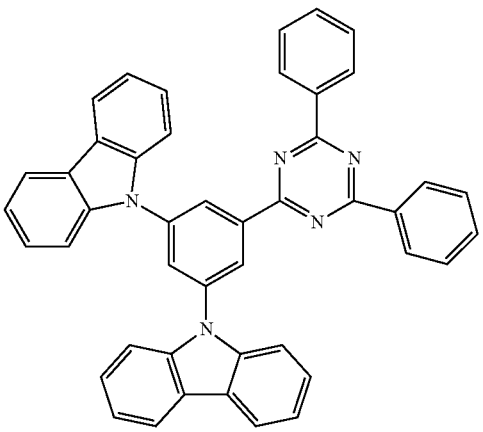
E-2-23
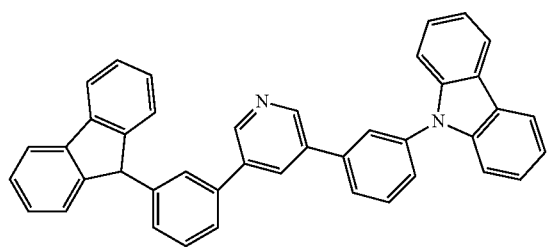

-continued

E-2-24

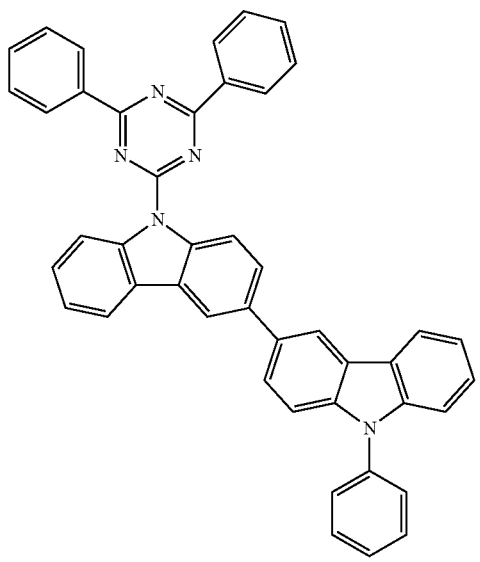

The emission layer EML may further include a general material such as a host compound. For example, the emission layer EML may include, as a host compound, at least one among bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4"-tris(carbazol-9-yl)-triphenylamine (TCTA), and 1,3,5-tris(1-phenyl-1H-benzo[d]imidazol-2-yl) benzene (TPBi). However, embodiments of the disclosure are not limited thereto, and for example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host compound.

The emission layer EML may further include a compound represented by Formula M-a or Formula M-b below as a light emitting material of an embodiment. The compound represented by Formula M-a or Formula M-b below may be used as a phosphorescent dopant compound.

[Formula M-a]

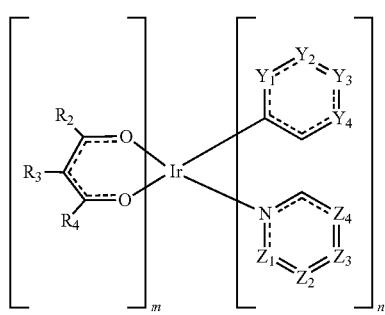

In Formula M-a above, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. In Formula M-a, m is 0 or 1, and n is 2 or 3. In Formula M-a, in case that m is 0, n is 3, and in case that m is 1, n is 2.

The compound represented by Formula M-a may be used as a phosphorescent dopant.

The compound represented by Formula M-a may be represented by any one of compounds M-a1 to M-a25 below. However, the compounds M-a1 to M-a21 below are presented as an example, and the compound represented by Formula M-a is not limited to those represented by the compounds M-a1 to M-a21 below.

M-a1

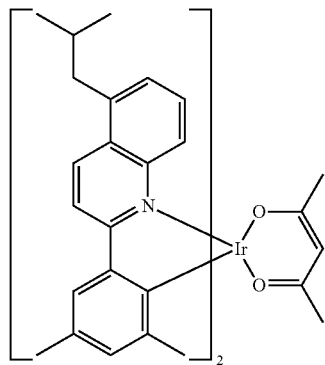

M-a2

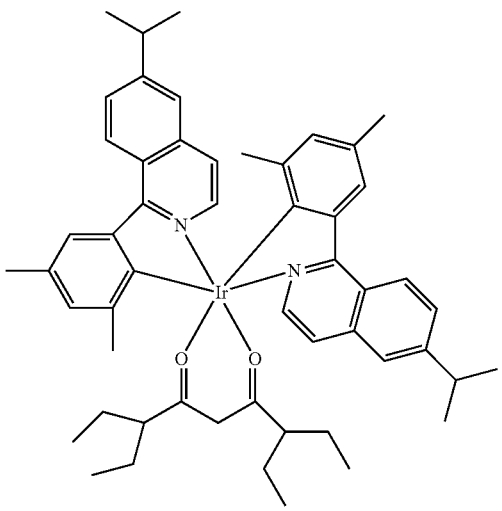

M-a3
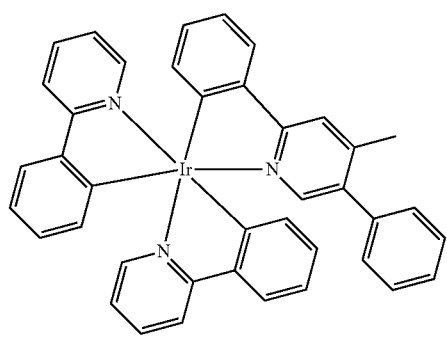
M-a4
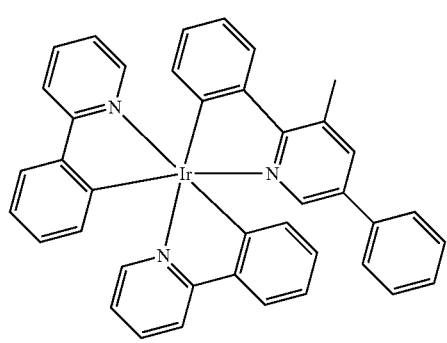
M-a5
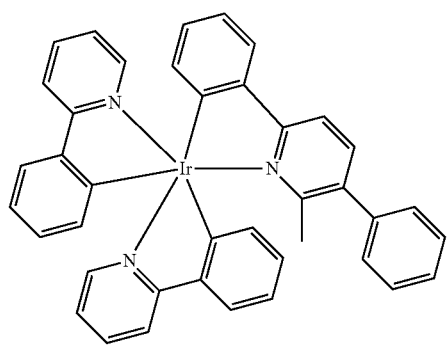
M-a6
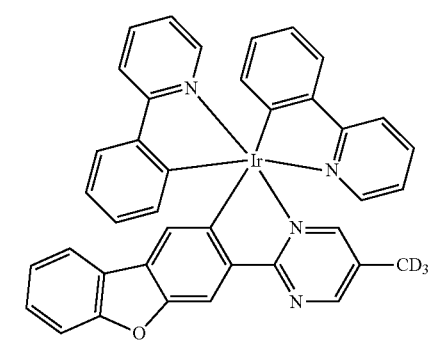
M-a7
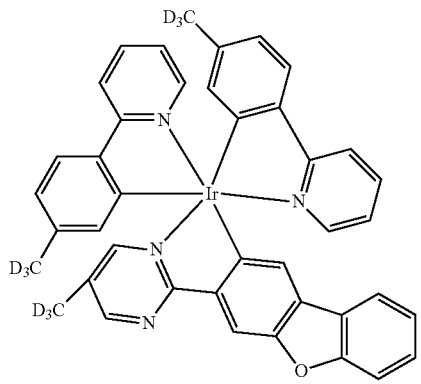
M-a8
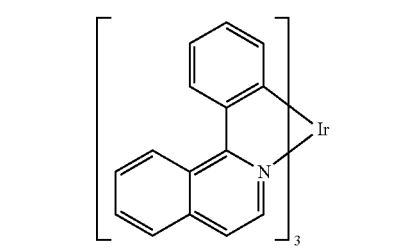
M-a9
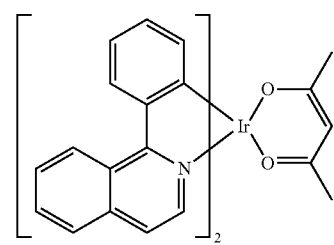
M-a10
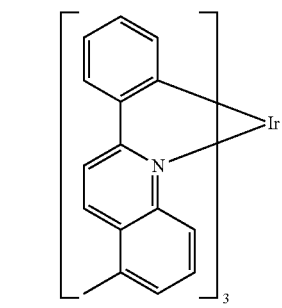
M-a11
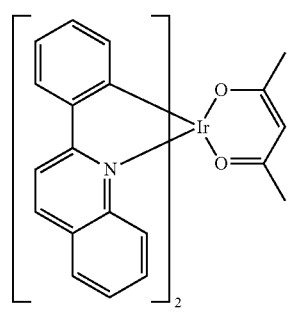

M-a12
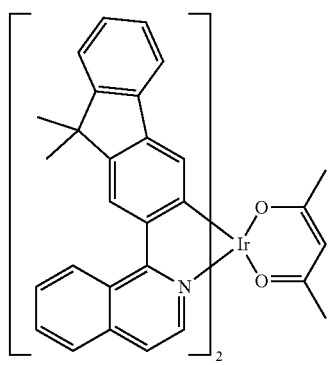
M-a13
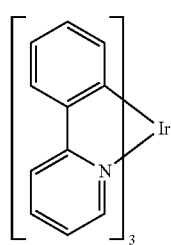
M-a14
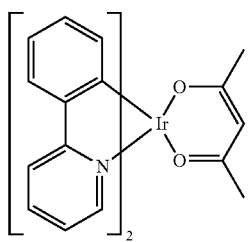
M-a15
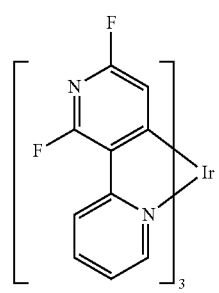
M-a16
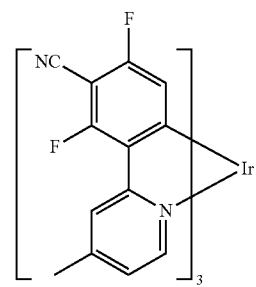
M-a17
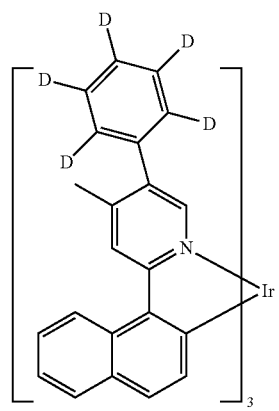
M-a18
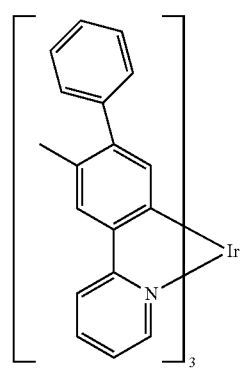
M-a19
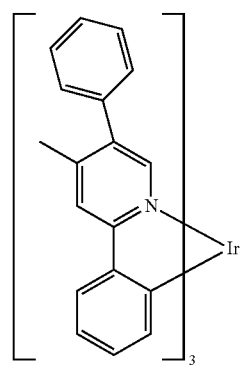
M-a20
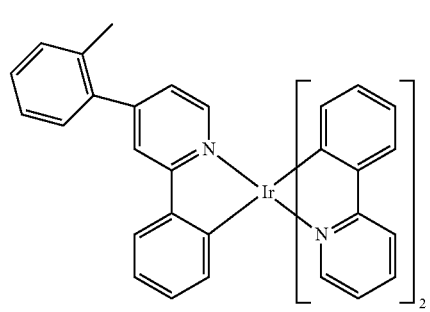

-continued

M-a21
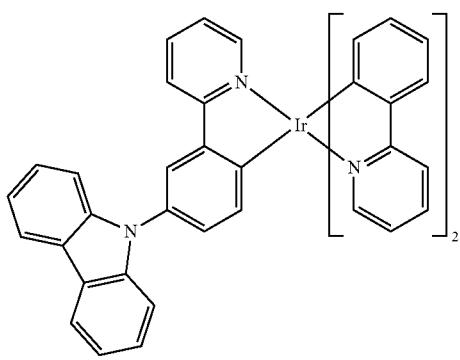

M-a22
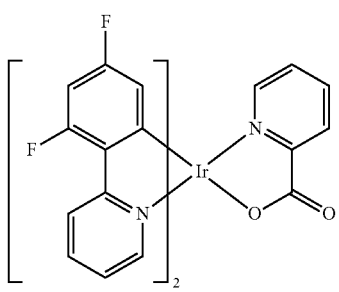

M-a23
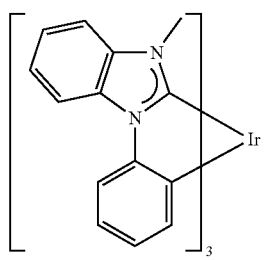

M-a24
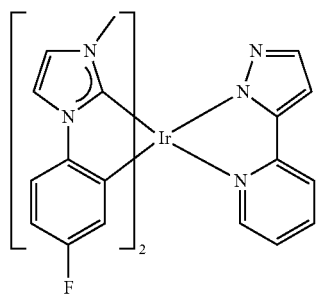

M-a25
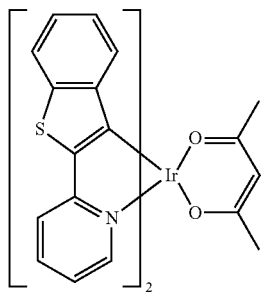

The compounds M-a1 and M-a2 may be used as a red dopant material, and the compounds M-a3 to M-a7 may be used as a green dopant material.

[Formula M-b]
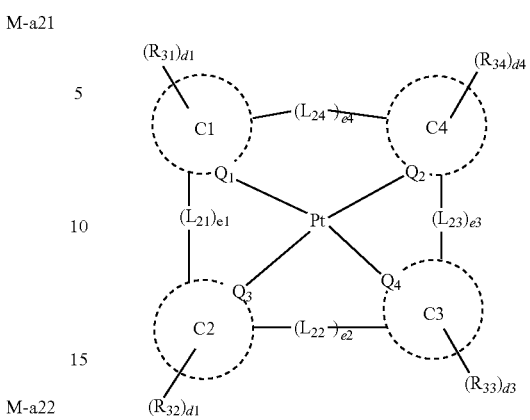

In Formula M-b, $Q_1$ to $Q_4$ are each independently C or N, and C1 to C4 are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

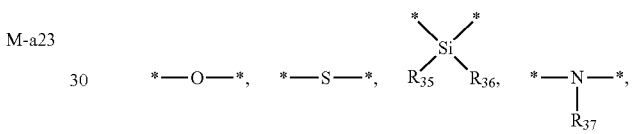

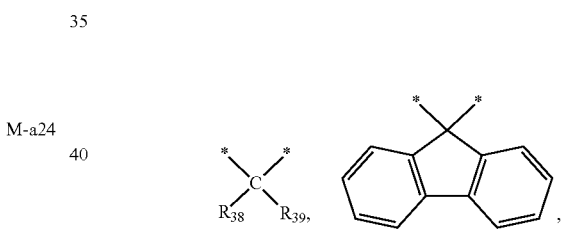

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and d1 to d4 are each independently an integer of 0 to 4.

The compound represented by Formula M-b may be used as a blue phosphorescent dopant or a green phosphorescent dopant.

The compound represented by Formula M-b may be represented by any one of compounds below. However, the compounds below are presented as an example, and the compound represented by Formula M-b is not limited to those represented by the compounds below.

M-b-1
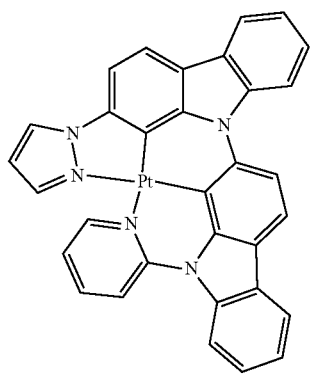
M-b-2
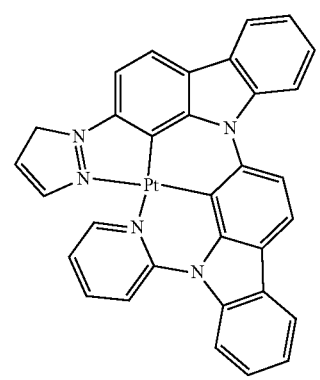
M-b-3
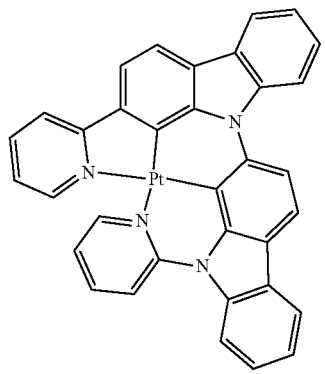
M-b-4
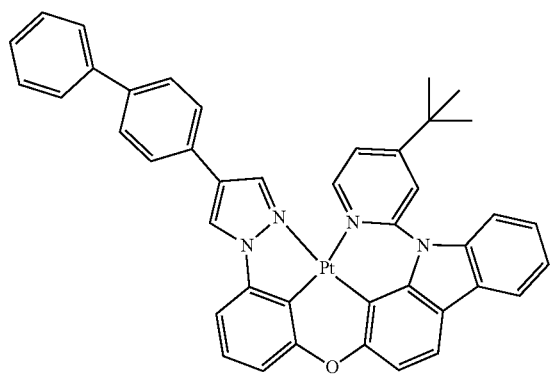
M-b-5
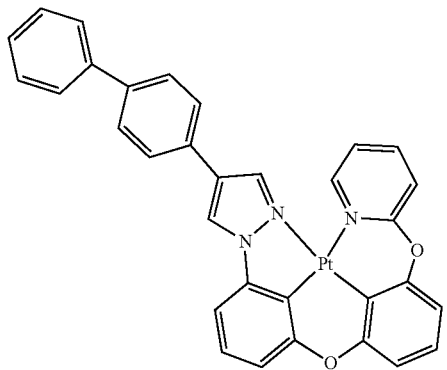
M-b-6
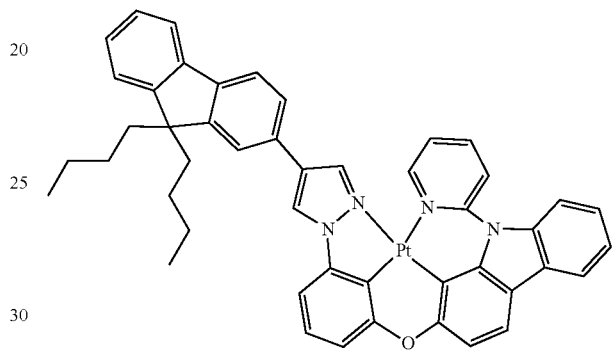
M-b-7
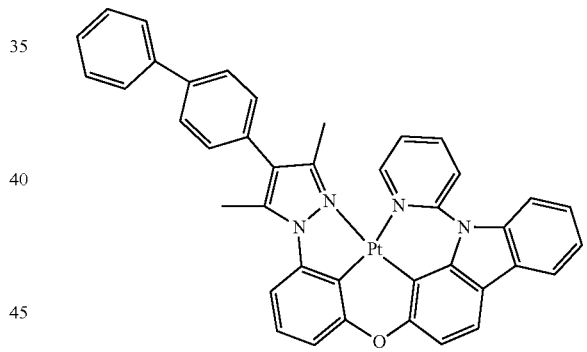
M-b-8
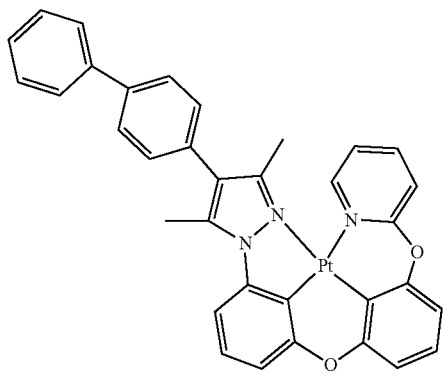

-continued

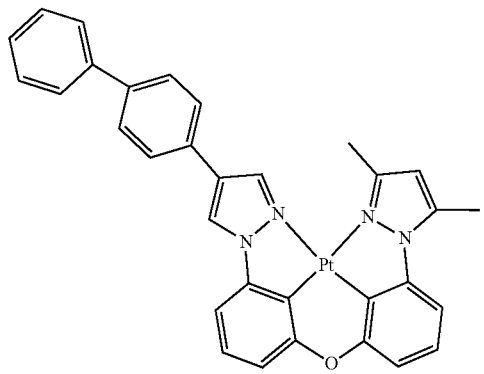

M-b-9

M-b-10

M-b-11

M-b-12

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include, in addition to a light emitting polymer compound according to an embodiment, a compound represented by any one of Formulas F-a to F-c below. The compounds represented by Formulas F-a to F-c below may be used as a fluorescent dopant material.

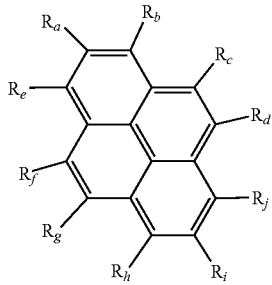

[Formula F-a]

In Formula F-a above, two selected from $R_a$ to $R_j$ may each independently be substituted with *——$NAr_1Ar_2$. The rest of $R_a$ to $R_j$ which may not be substituted with *——$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *——$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, In Formula F-b, in case that the number of U or V is 1, one ring forms a fused ring in a portion indicated by U or V, and in case that the number of U or V is 0, it means that no ring indicated by U or V may be present. To be specific, in case that the number of U is 0 and the number of V is 1, or in case that the number of U is 1 and the number of V is 0, a fused ring having a fluorene core of Formula F-b may be a cyclic compound having four rings. In case that both U and V are 0, the fused ring of Formula F-b may be a cyclic compound having three rings. In case that both U and V are 1, the fused ring having a fluorene core of Formula F-b may be a cyclic compound having five rings.

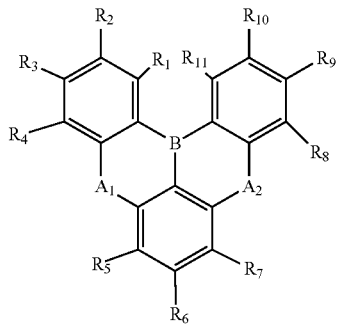

[Formula F-c]

In Formula F-c, $A_1$ and $A_2$ may each independently be O, S, Se, or $NR_m$, and $R_m$, may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula F-c, $A_1$ and $A_2$ may each independently be bonded to substituents of neighboring rings to form a fused ring. For example, in case that $A_1$ and $A_2$ are each independently $NR_m$, $A_1$ may be bonded to $R_4$ or $R_5$ to form a ring. $A_2$ may be bonded to $R_7$ or $R_8$ to form a ring.

In an embodiment, as a light emitting material of an embodiment, the emission layer EML may further include, as a dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

The emission layer EML may further include a phosphorescent dopant material as a light emitting material according to an embodiment. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. To be specific, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), platinum octaethyl porphyrin (PtOEP), etc. may be used as a phosphorescent dopant. However, embodiments of the disclosure are not limited thereto.

In the light emitting diode ED of an embodiment illustrated in FIGS. 3 to 7, an electron transport region ETR is provided on the emission layer EML. The electron transport region ETR may include at least one of a hole blocking layer HBL, an electron transport layer ETL, and an electron injection layer EIL, but embodiments of the disclosure are not limited thereto.

The electron transport region ETR may have a single layer formed of a single material, a single layer formed of different materials, or a multilayer structure having multiple layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL, or a hole blocking layer HBL/electron transport layer ETL/electron injection layer EIL are stacked in order from the emission layer EML, but is not limited thereto. The electron transport region ETR may have a thickness of, for example, about 1000 Å to about 1500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc., or a combination thereof.

The electron transport region ETR may include an anthracene-based compound. However, embodiments of the disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include halogenated metals such as LiF, NaCl, CsF, RbCl, RbI, CuI, and KI, lanthanide metals such as Yb, co-deposition materials of a halogenated metal and a lanthanide metal. For example, the electron transport region ETR may include KI:Yb, RbI:Yb, etc. as a co-deposition material. For the electron transport region ETR, a metal oxide such as $Li_2O$ and BaO, or 8-hydroxyl-lithium quinolate (Liq), etc. may be used, but the embodiment of the disclosure is limited thereto. The electron transport region ETR may also be formed of a mixture material of an electron transport material and an insulating organo-metal salt. The organo-metal salt may be a material having an energy band gap of about 4 eV or greater. Specifically, the organo-metal salt may include, for example, metal acetates, metal benzoates, metal acetoacetates, metal acetylacetonates, metal stearates, or a combination thereof.

The electron transport region ETR may further include, for example, at least one of 2,9-dimethyl-4,7-diphenyl-1,10-phenanthroline (BCP) or 4,7-diphenyl-1,10-phenanthroline (Bphen) in addition to the materials described above, but embodiments of the disclosure are not limited thereto.

The electron transport region ETR may include the compounds of the electron transport region described above in at least one of the electron injection layer EIL, the electron transport layer ETL, or the hole blocking layer HBL.

In case that the electron transport region ETR includes the electron transport layer ETL, the electron transport layer ETL may have a thickness of about 100 Å to about 1000 Å, for example, about 150 Å to about 500 Å. In case that the thickness of the electron transport layer ETL satisfies the above-described range, satisfactory electron transport properties may be obtained without a substantial increase in driving voltage. In case that the electron transport region ETR includes the electron injection layer EIL, the electron injection layer EIL may have a thickness of about 1 Å to about 100 Å, for example, about 3 Å to about 90 Å. In case that the thickness of the electron injection layer EIL satisfies the above-described ranges, satisfactory electron injection properties may be obtained without a substantial increase in driving voltage.

The second electrode EL2 may be provided on the electron transport region ETR. The second electrode EL2 may be a common electrode. The second electrode EL2 may be a cathode or an anode but embodiments of the disclosure are not limited thereto. For example, in case that the first electrode EL1 is an anode, the second electrode EL2 may be a cathode, and in case that the first electrode EL1 is a cathode, the second electrode EL2 may be an anode.

The second electrode EL2 may be a transmissive electrode, a transflective electrode, or a reflective electrode. In case that the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc., or a combination thereof.

In case that the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In other embodiments, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown, the second electrode EL2 may be electrically connected with an auxiliary electrode. In case that the second electrode EL2 is electrically connected with the auxiliary electrode, the resistance of the second electrode EL2 may decrease.

The capping layer CPL may be further disposed on the second electrode EL2 of the light emitting diode ED of an embodiment. The capping layer CPL may include a multi-layer or a single layer.

In an embodiment, the capping layer CPL may be an organic layer or an inorganic layer. For example, in case that the capping layer CPL includes an inorganic material, the inorganic material may include an alkali metal compound such as LiF, an alkaline earth metal compound such as $MgF_2$, SiON, SiNx, SiOy, etc., or a combination thereof.

For example, in case that the capping layer CPL includes an organic material, the organic material may include α-NPD, NPB, TPD, m-MTDATA, $Alq_3$ CuPc, N4,N4,N4', N4'-tetra(biphenyl-4-yl) biphenyl-4,4'-diamine (TPD15), 4,4',4"-tris(carbazol sol-9-yl)triphenylamine (TCTA), etc., or may include epoxy resins or acrylates such as methacrylates. However, embodiments of the disclosure are not limited thereto, and the capping layer CPL may include at least one of compounds P1 to P5 below.

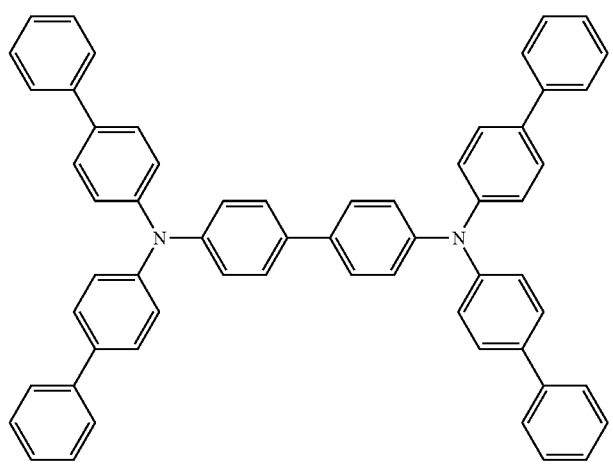

P1

-continued
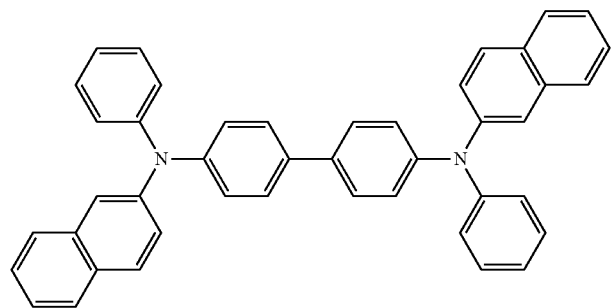
P2
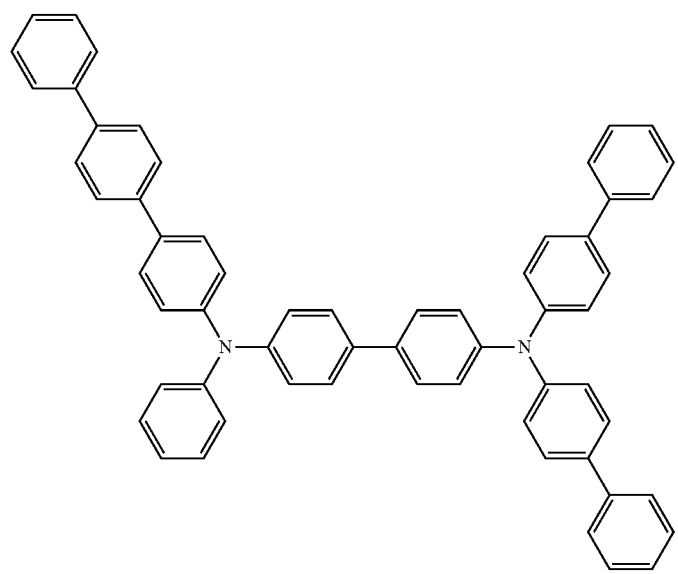
P3
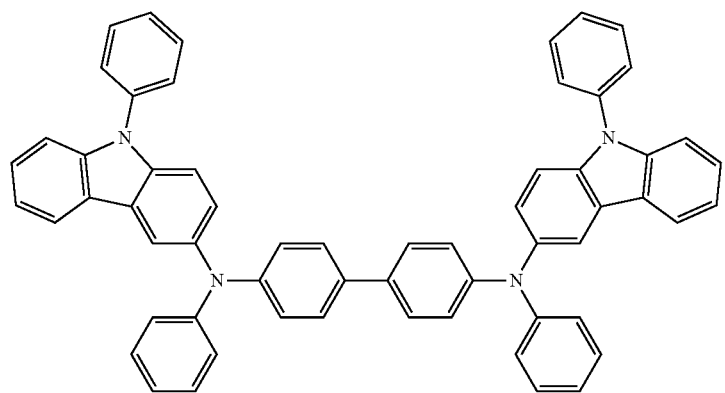
P4

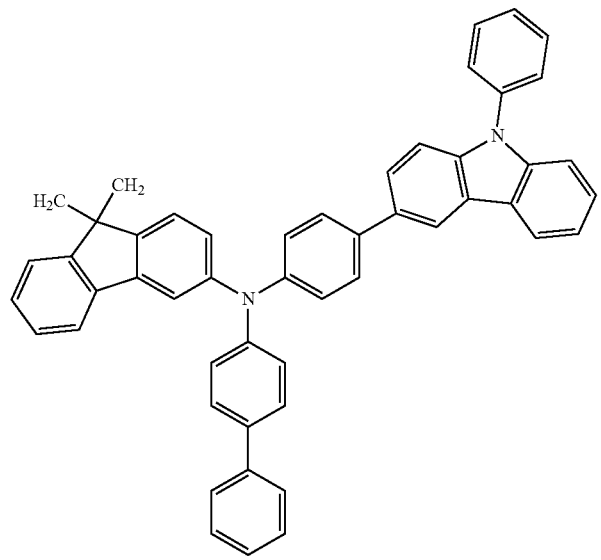

P5

The capping layer CPL may have a refractive index of about 1.6 or greater. To be specific, the capping layer CPL may have a refractive index of about 1.6 or greater in a wavelength range of about 550 nm to about 660 nm.

Figure 7:
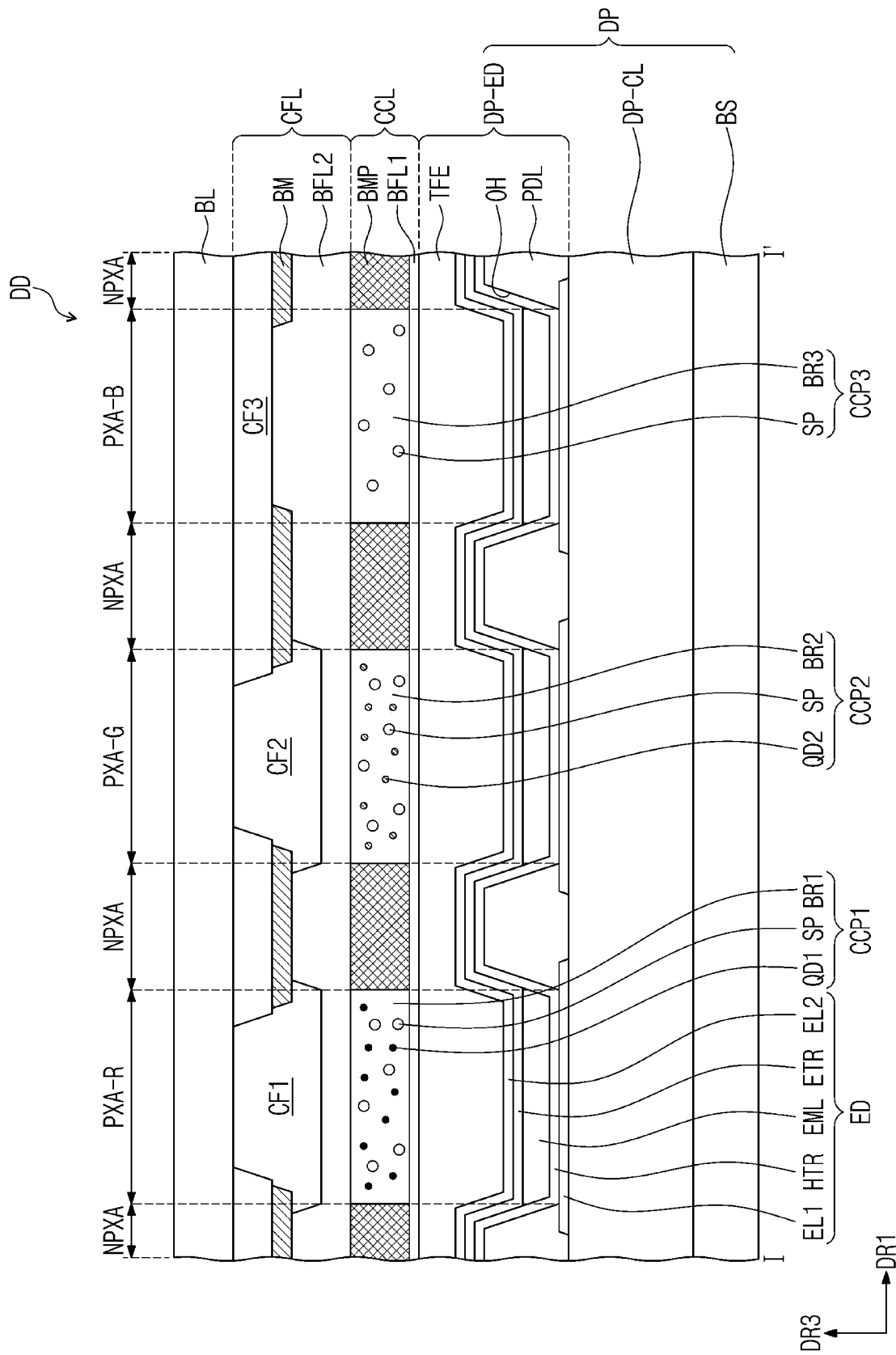
FIG. 7 is a cross-sectional view schematically showing a display device according to an embodiment of the disclosure.
Figure 8:
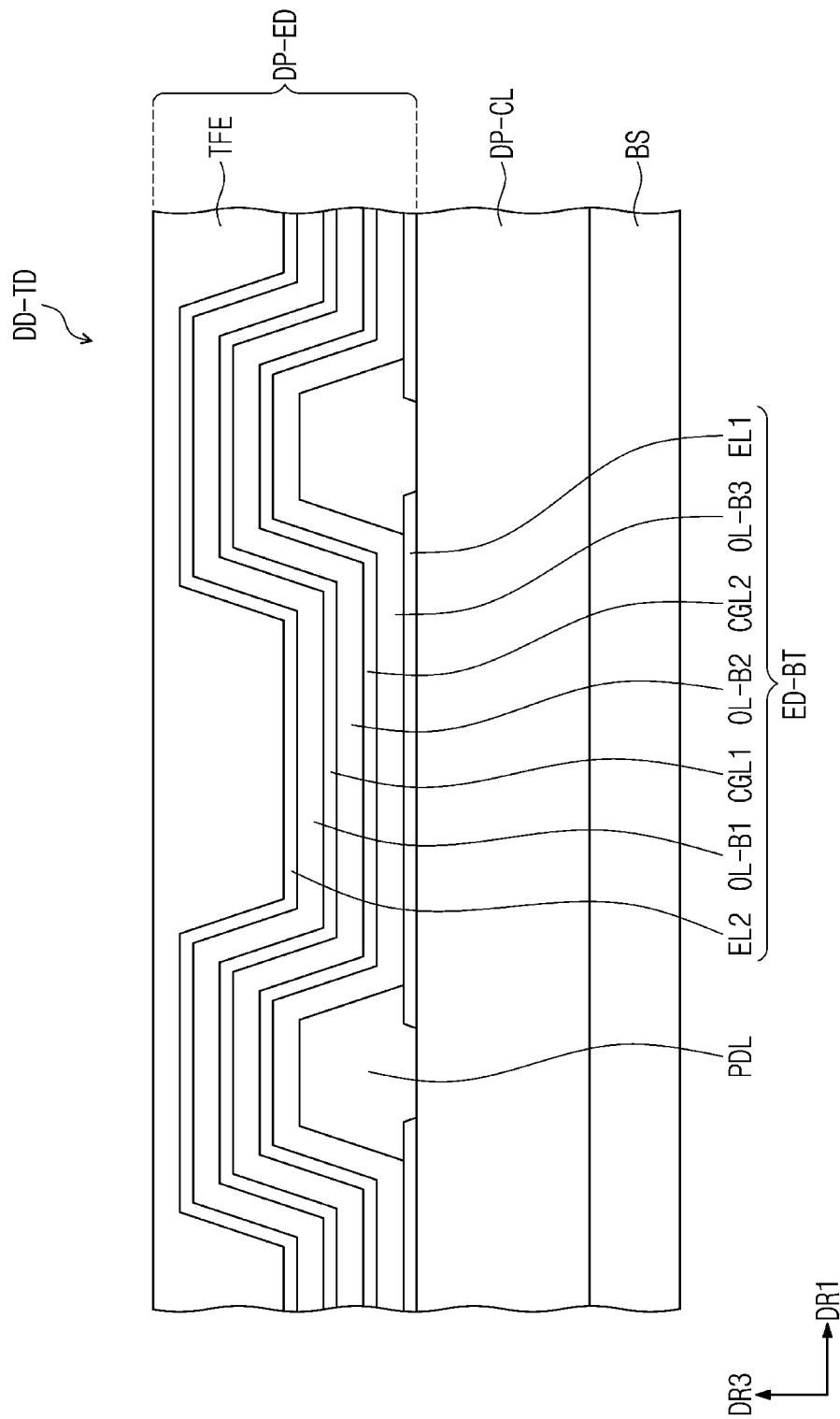
FIG. 8 is a cross-sectional view schematically showing a display device according to an embodiment of the disclosure.

FIGS. 7 and 8 are each cross-sectional views schematically showing a display device according to an embodiment of the disclosure. Hereinafter, in the description of the display device according to an embodiment with reference to FIGS. 7 and 8, content redundant with that described above with reference to FIGS. 1 to 6 will not be described again, and differences will be described.

Referring to FIG. 7, a display device DD according to an embodiment may include a display panel DP having a display element layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and a display element layer DP-ED, and the display element layer DP-ED may include a light emitting diode ED.

The light emitting diode ED may include a first electrode ELL a hole transport region HTR disposed on the first electrode ELL an emission layer EML disposed on the hole transport region HTR, an electron transport region ETR disposed on the emission layer EML, and a second electrode EL2 disposed on the electron transport region ETR. A structure of the light emitting diode ED shown in FIG. 8 may be the same as the structure of the light emitting diode of FIGS. 3 to 6 described above.

Referring to FIG. 7, the emission layer EML may be disposed in the openings OH defined in the pixel defining films PDL. For example, the emission layer EML separated by the pixel defining films PDL and provided corresponding to each of light emitting regions PXA-R, PXA-G, and PXA-B may emit light in the same wavelength ranges. In the display device DD of an embodiment, the emission layer EML may emit blue light. Unlike what is shown, in an embodiment, the emission layer EML may be provided as a common layer throughout the light emitting regions PXA-R, PXA-G, and PXA-B.

The light control layer CCL may be disposed on the display panel DP. The light control layer CCL may include a photoconverter. The photoconverter may be a quantum dot or a phosphor. The photoconverter may convert the wavelength of received light, and emit the resulting light. For example, the light control layer CCL may be a layer containing quantum dots or phosphors.

The light control layer CCL may include light control units CCP1, CCP2, and CCP3. The light control units CCP1, CCP2, and CCP3 may be spaced apart from each other.

Referring to FIG. 7, a division pattern BMP may be disposed between the light control units CCP1, CCP2, and CCP3 spaced apart from each other, but embodiments of the disclosure are not limited thereto. In FIG. 7, the division pattern BMP is shown to not overlap the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 for converting first color light provided from the light emitting diode ED into second color light, a second light control unit CCP2 including a second quantum dot QD2 for converting the first color light into third color light, and a third light control unit CCP3 transmitting the first color light.

In an embodiment, the first light control unit CCP1 may provide red light, which is the second color light, and the second light control unit CCP2 may provide green light, which may be the third color light. The third light control unit CCP3 may transmit and provide blue light, which may be the first color light provided from the light emitting diode ED. For example, the first quantum dot QD1 may be a red quantum dot and the second quantum dot QD2 may be a green quantum dot.

The core of a quantum dot may be selected from a Group II-VI compound, a Group III-VI compound, a Group compound, a Group III-V compound, a Group III-II-V compound, a Group IV-VI compound, a Group IV element, a Group IV compound, and a combination thereof.

The Group II-VI compound may be selected from the group of a binary compound selected from the group of CdSe, CdTe, CdS, ZnS, ZnSe, ZnTe, ZnO, HgS, HgSe, HgTe, MgSe, MgS, and a mixture thereof, a ternary compound selected from the group of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may include a ternary compound selected from the group of AgInS, $AgInS_2$, CuInS, $CuInS_2$, $AgGaS_2$, $CuGaS_2$ $CuGaO_2$, $AgGaO_2$, $AgAlO_2$, or any mixture thereof, or a quaternary compound such as $AgInGaS_2$ and $CuInGaS_2$.

The Group III-V compound may be selected from the group of a binary compound selected from the group of GaN, GaP, GaAs, GaSb, AlN, AlP, AlAs, AlSb, InN, InP, InAs, InSb, and a mixture thereof, a ternary compound selected from the group of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group of a binary compound selected from the group of SnS, SnSe, SnTe, PbS, PbSe, PbTe, and a mixture thereof, a ternary compound selected from the group of SnSeS, SnSeTe, SnSTe, PbSeS, PbSeTe, PbSTe, SnPbS, SnPbSe, SnPbTe, and a mixture thereof, and a quaternary compound selected from the group of SnPbSSe, SnPbSeTe, SnPbSTe, and a mixture thereof. The Group IV element may be selected from the group of Si, Ge, and a mixture thereof. The Group IV compound may be a binary compound selected from the group of SiC, SiGe, and a mixture thereof.

A binary compound, a ternary compound, or a quaternary compound may be present in particles in a uniform concentration distribution, or may be present in the same particles in a partially different concentration distribution. A core/shell structure in which one quantum dot surrounds another quantum dot may be present. The core/shell structure may have a concentration gradient in which the concentration of an element present in the shell becomes lower towards the core.

In some embodiments, a quantum dot may have the core/shell structure including a core having nano-crystals, and a shell surrounding the core, which are described above. The shell of the quantum dot may serve as a protection layer to prevent the chemical deformation of the core so as to keep semiconductor properties, and/or a charging layer to impart electrophoresis properties to the quantum dot. The shell may be a single layer or multiple layers. Examples of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a combination thereof, or a ternary compound such as $MgAl_2O_4$, $CoFe_2O_4$, $NiFe_2O_4$, and $CoMn_2O_4$, or a combination thereof, but embodiments of the disclosure are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., or a combination thereof, but embodiments of the disclosure are not limited thereto.

A quantum dot may have a full width of half maximum (FWHM) of a light emitting wavelength spectrum of about 45 nm or less, for example about 40 nm or less, and in another embodiment, about 30 nm or less, and color purity or color reproducibility may be enhanced in the above ranges. Light emitted through such a quantum dot is emitted in all directions, and thus a wide viewing angle may be improved.

Although the form of a quantum dot is not particularly limited as long as it is a form commonly used in the art, and more specifically, a quantum dot in the form of spherical, pyramidal, multi-arm, or cubic nanoparticles, nanotubes, nanowires, nanofibers, nanoplatelets, etc. may be used.

The quantum dot may control the colors of emitted light according to the particle size thereof, and thus the quantum dot may have various light emission colors such as blue, red, green, etc.

Referring back to FIG. 7, the light control layer CCL may further include scatterers SP. The first light control unit CCP1 may include the first quantum dot QD1 and the scatterers SP, the second light control unit CCP2 may include the second quantum dot QD2 and the scatterers SP, and the third light control unit CCP3 may not include a quantum dot but may include the scatterers SP.

The scatterers SP may be inorganic particles. For example, the scatterers SP may include at least one among $TiO_2$, ZnO, $Al_2O_3$, $SiO_2$, and hollow silica. The scatterers SP may include any one among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may each include base resins BR1, BR2, and BR3 for dispersing the quantum dots QD1 and QD2 and the scatterers SP. In an embodiment, the first light control unit CCP1 may include the first quantum dot QD1 and the scatterers SP dispersed in the first base resin BR1, the second light control unit CCP2 may include the second quantum dot QD2 and the scatterers SP dispersed in the second base resin BR2, and the third light control unit CCP3 may include the scatterers SP dispersed in the third base resin BR3. The base resins BR1, BR2, and BR3 may be a medium in which the quantum dots QD1 and QD2 and the scatterers SP may be dispersed, and may be formed of various resin compositions, which may be generally referred to as a binder. For example, the base resins BR1, BR2, and BR3 may be an acrylic-based resin, a urethane-based resin, a silicone-based resin, an epoxy-based resin, etc., or a combination thereof. The base resins BR1, BR2, and BR3 may be a transparent resin. In an embodiment, the first base resin BR1, the second base resin BR2, and the third base resin BR3 may each be the same as or different from each other.

The light control layer CCL may include a barrier layer BFL1. The barrier layer BFL1 may serve to prevent moisture and/or oxygen (hereinafter referred to as "moisture/oxygen") from being introduced. The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. A barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc., or a combination thereof. The barrier layers BFL1 and BFL2 may further include an organic film. The barrier layers BFL1 and BFL2 may be formed of a single layer or multiple layers.

In the display device DD of an embodiment, the color filter layer CFL may be disposed on the light control layer CCL. For example, the color filter layer CFL may be directly disposed on the light control layer CCL. The barrier layer BFL2 may be omitted.

The color filter layer CFL may include a light blocking unit BM and filters. For example, the color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. The filters CF1, CF2, and CF3 may each include a polymer photosensitive resin, a pigment or a dye, or a combination thereof. The first filter CF1 may include a red pigment or a red dye, the second filter CF2 may include a green pigment or a green dye, and the third filter CF3 may include a blue pigment or a blue dye. Embodiments of the disclosure are not limited thereto, and the third filter CF3 may not include a pigment or a dye. The third filter CF3 may include a polymer photosensitive resin, but not include a pigment or a dye. The third filter CF3 may be transparent. The third filter CF3 may be formed of a transparent photosensitive resin.

In an embodiment, the first filter CF1 and the second filter CF2 may be yellow filters. The first filter CF1 and the second filter CF2 may not be separated from each other and may be provided as a single body.

The light blocking unit BM may be a black matrix. The light blocking unit BM may be formed including an organic light blocking material or an inorganic light blocking material, both including a black pigment or a black dye. The light blocking unit BM may prevent light leakage, and separate boundaries between the adjacent filters CF1, CF2, and CF3. In an embodiment, the light blocking unit BM may be formed of a blue filter.

The first to third filters CF1, CF2, and CF3 may be disposed corresponding to the red light emitting region PXA-R, green light emitting region PXA-G, and blue light emitting region PXA-B, respectively.

The base substrate BL may be disposed on the color filter layer CFL. The base substrate BL may be a member providing a base surface on which the color filter layer CFL and the light control layer CCL are disposed. The base substrate BL may be a glass substrate, a metal substrate, a plastic substrate, or the like, or a combination thereof. However, embodiments of the disclosure are not limited thereto, and the base substrate BL may be an inorganic layer, an organic layer, or a composite material layer. Unlike what is shown, the base substrate BL may be omitted in an embodiment.

FIG. 8 is a cross-sectional view schematically showing a portion of a display device according to an embodiment of the disclosure. FIG. 8 shows a cross-sectional view of a portion corresponding to the display panel DP of FIG. 7. In a display device DD-TD of an embodiment, a light emitting diode ED-BT may include light emitting structures OL-B1, OL-B2, and OL-B3. The light emitting diode ED-BT may include the first electrode EL1 and the second electrode EL2 facing each other, and the light emitting structures OL-B1, OL-B2, and OL-B3 provided by being sequentially stacked in a thickness direction between the first electrode EL1 and the second electrode EL2. The light emitting structures OL-B1, OL-B2, and OL-B3 each may include the emission layer EML (FIG. 7), and a hole transport region HTR and an electron transport region ETR disposed with the emission layer EML (FIG. 7) therebetween.

For example, the light emitting diode ED-BT included in the display device DD-TD of an embodiment may be a light emitting diode having a tandem structure including multiple emission layers.

In an embodiment illustrated in FIG. 8, light emitted from each of the light emitting structures OL-B1, OL-B2, and OL-B3 may all be blue light. However, embodiments of the disclosure are not limited thereto, and wavelength ranges of light emitted from each of the light emitting structures OL-B1, OL-B2, and OL-B3 may be different from each other. For example, the light emitting diode ED-BT including the light emitting structures OL-B1, OL-B2, and OL-B3 emitting light in different wavelength ranges may emit white light.

A charge generation layer CGL may be disposed between neighboring light emitting structures OL-B1, OL-B2, and OL-B3. The charge generation layer CGL may include a p-type charge generation layer and/or an n-type charge generation layer.

Hereinafter, a method for manufacturing a light emitting diode according to an embodiment will be described in detail with reference to FIGS. 9 to 12. The structural features of the above-described light emitting diode will not be described again, and features of the manufacturing method will be described in detail.

Figure 9:
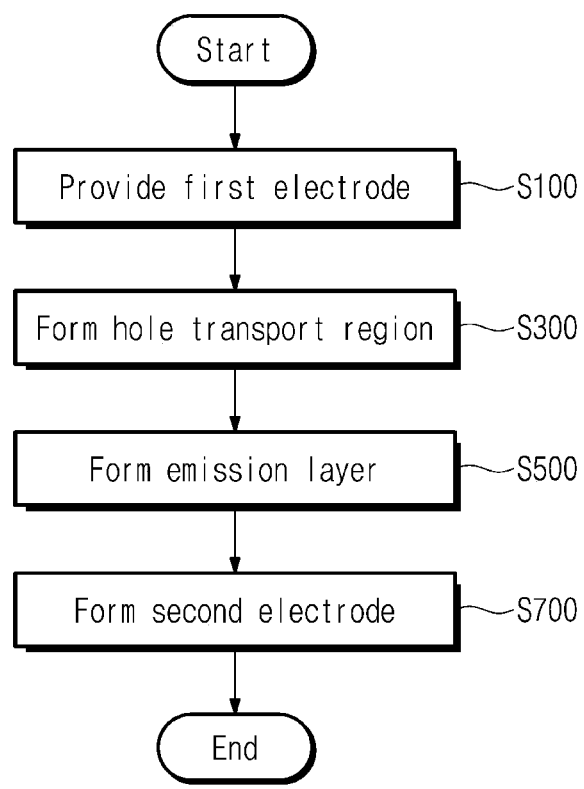
FIG. 9 is a schematic flowchart of a method for manufacturing a light emitting diode according to an embodiment.
Figure 10:
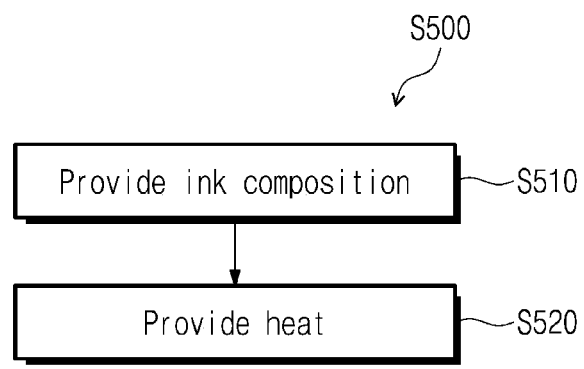
FIG. 10 is a detailed schematic flowchart of a step in a method for manufacturing a light emitting diode according to an embodiment.
Figure 11:
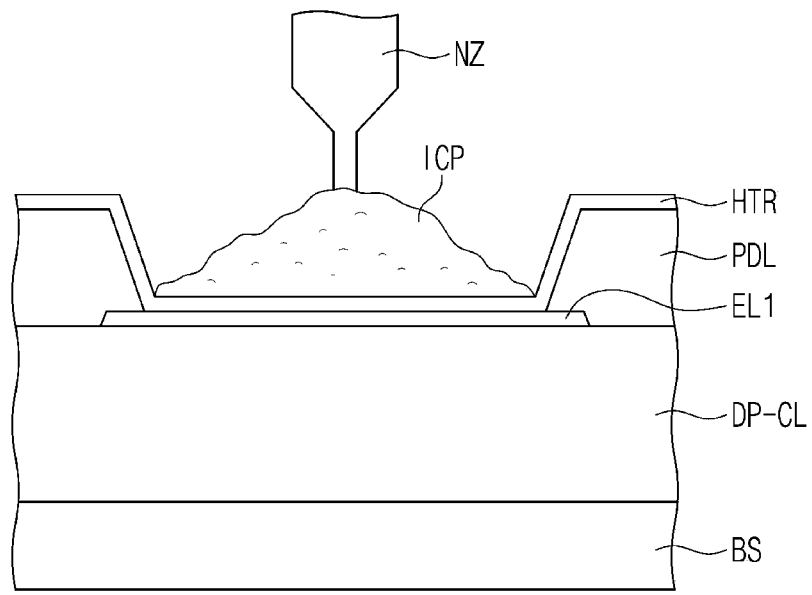
FIGS. 11 and 12 are views schematically illustrating a step in a method for manufacturing a light emitting diode according to an embodiment.
Figure 12:
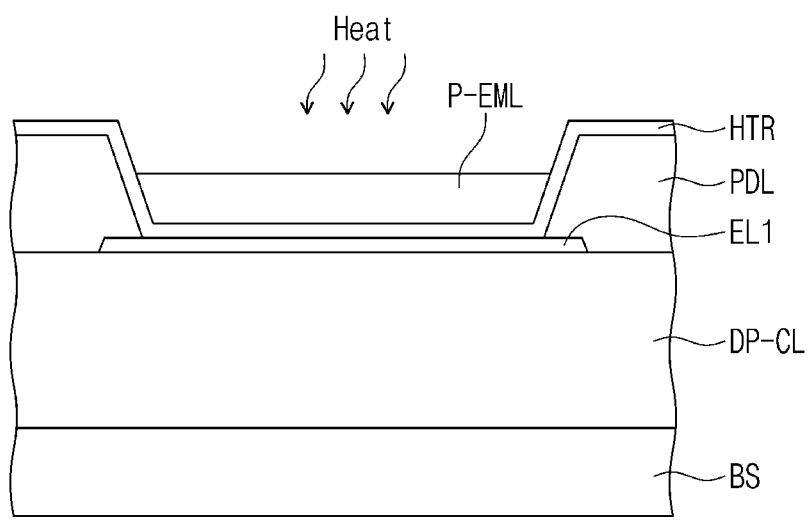

FIG. 9 is a schematic flowchart of a method for manufacturing a light emitting diode according to an embodiment. FIG. 10 is a detailed schematic flowchart of a step in a method for manufacturing a light emitting diode according to an embodiment. FIGS. 11 and 12 are views schematically illustrating a step in a method for manufacturing a light emitting diode according to an embodiment.

Referring to FIG. 9, a method for manufacturing a light emitting diode according to an embodiment may include providing a first electrode S100, forming a hole transport region S300, forming an emission layer S500, and forming a second electrode S700. The forming a hole transport region S300 may refer to forming a hole transport region on the first electrode. The forming of the emission layer S500 may refer to forming an emission layer on the hole transport region. The forming of a second electrode S700 may refer to forming a second electrode on the emission layer.

FIG. 10 is a detailed flowchart of the forming of an emission layer S500. Referring to FIG. 10, the forming of the emission layer S500 may include providing an ink composition S510, and providing heat or light S520.

FIG. 11 is a view schematically illustrating providing an ink composition according to an embodiment. Referring to FIG. 11, the providing of an ink composition S510 according to an embodiment may refer to providing an ink composition ICP on the hole transport region HTR, using a nozzle NZ, to form a preliminary emission layer P-EML. The providing of the ink composition ICP may be performed through inkjet printing.

The ink composition ICP may include a mixed solvent containing a first solvent and a second solvent, and a light emitting material. The descriptions above may be equally applied to the ink composition ICP.

FIG. 12 is a view schematically illustrating providing heat S520. The providing of heat S520 may include providing heat to the preliminary emission layer P-EML to evaporate a portion of the mixed solvent. In the providing of heat S520, the heating temperature may be about 160° C. or less. The first solvent and the second solvent included in the ink composition ICP each may have a vapor pressure of about $1 \times 10^{-4}$ or greater, and a boiling point of about 270° C. or less, and in addition, the mixed solvent including the first solvent and the second solvent may have a relative evaporation rate of about 30,000 or less, and thus, while providing heat at about 160° C. or less, the process time for forming the emission layer EML may be shortened.

Hereinafter, embodiments of the disclosure will be described in more detail through specific Examples and Comparative Examples. Examples shown below are illustrated only for the understanding of the disclosure, and the scope of the disclosure is not limited thereto.

Table 1 below shows vapor pressure (VP), boiling point (BP), and relative evaporation rate (RER) of solvents included in each of mixed solvents of Comparative Example and Examples, and relative evaporation rate of each of the mixed solvent (RER of Mixture) of Comparative Example and Examples.

TABLE 1

| | Solvent | Amount (%) | V.P. | B.P. | RER | RER of Mixture |
|---|---|---|---|---|---|---|
| Comparative Example 1 | EMB (Ethyl 4-methylbenzoate) | 82 | $4.9 \times 10^{-2}$ | 232 | 4,842 | 475,900 |
| | IIBP (Diisopropylbiphenyl) | 18 | $3 \times 10^{-5}$ | 300 | 3,882,256 | |
| Example 1 | IBB (Isobutyl Benzoate) | 80 | $5 \times 10^{-2}$ | 240 | 4,023 | 10,150 |
| | DPE (Diphenyl Ether) | 20 | $2 \times 10^{-3}$ | 258 | 33,644 | |
| Example 2 | IAB (Isoamylbenzoate) | 80 | $2 \times 10^{-2}$ | 246 | 12,100 | 17,000 |
| | DPE (Diphenyl Ether) | 20 | $2 \times 10^{-3}$ | 258 | 33,644 | |
| Example 3 | MB (Methylbenzoate) | 80 | $3 \times 10^{-1}$ | 200 | 793 | 7,430 |
| | DPE (Diphenyl Ether) | 20 | $2 \times 10^{-3}$ | 258 | 33,644 | |
| Example 4 | CHB (Cyclohexylbenzene) | 80 | $8 \times 10^{-2}$ | 230 | 3,152 | 8,960 |
| | DPE (Diphenyl Ether) | 20 | $2 \times 10^{-3}$ | 258 | 33,644 | |
| Example 5 | IBB (Isobutyl Benzoate) | 80 | $5 \times 10^{-2}$ | 240 | 4,023 | 19,065 |
| | PGpE (Propylene Glycol 1-Monophenyl Ether) | 20 | $3 \times 10^{-3}$ | 244 | 70,455 | |
| Example 6 | IAB (Isoamylbenzoate) | 80 | $2 \times 10^{-2}$ | 246 | 12,100 | 26,433 |
| | PGpE (Propylene Glycol 1-Monophenyl Ether) | 20 | $3 \times 10^{-3}$ | 244 | 70,455 | |
| Example 7 | MB (Methylbenzoate) | 80 | $3 \times 10^{-1}$ | 200 | 793 | 16,566 |
| | PGpE (Propylene Glycol 1-Monophenyl Ether) | 20 | $3 \times 10^{-3}$ | 244 | 70,455 | |
| Example 8 | CHB (Cyclohexylbenzene) | 80 | $8 \times 10^{-2}$ | 230 | 3,152 | 18,391 |
| | PGpE (Propylene Glycol 1-Monophenyl Ether) | 20 | $3 \times 10^{-3}$ | 244 | 70,455 | |

Table 2 below shows relative evaporation rate of the mixed solvent (RER of Mixture) in which the ratio of IBB:DPE was changed to be different from that of Example 1. Example 1-1 has an IBB:DPE ratio of about 6:4, Example 1-2 has an IBB:DPE ratio of about 6.2:3.8, and Example 1-3 has an IBB:DPE ratio of about 7:3.

TABLE 2

| | Solvent | Amount (%) | RER of Mixture |
|---|---|---|---|
| Example 1-1 | IBB (Isobutyl Benzoate) | 60 | 16,200 |
| | DPE (Diphenyl Ether) | 40 | |
| Example 1-2 | IBB (Isobutyl Benzoate) | 62 | 15,600 |
| | DPE (Diphenyl Ether) | 38 | |
| Example 1-3 | IBB (Isobutyl Benzoate) | 70 | 13,200 |
| | DPE (Diphenyl Ether) | 30 | |

Measurement of evaporation completion temperature. The mixed solvent of Comparative Example 1 was shown to have an evaporation completion temperature of about 160° C. as measured.

Example 1 was shown to have an evaporation completion temperature of about 160° C., and Example 2 was shown to have an evaporation completion temperature of about 130° C. to about 135° C. Accordingly, it is confirmed that the vapor pressure, boiling point, and relative evaporation rate of the mixed solvents herein are all controlled together, and thus, the temperature at which evaporation is completed may be lowered.

2. Evaluation of Elution Tests

Figure 13:
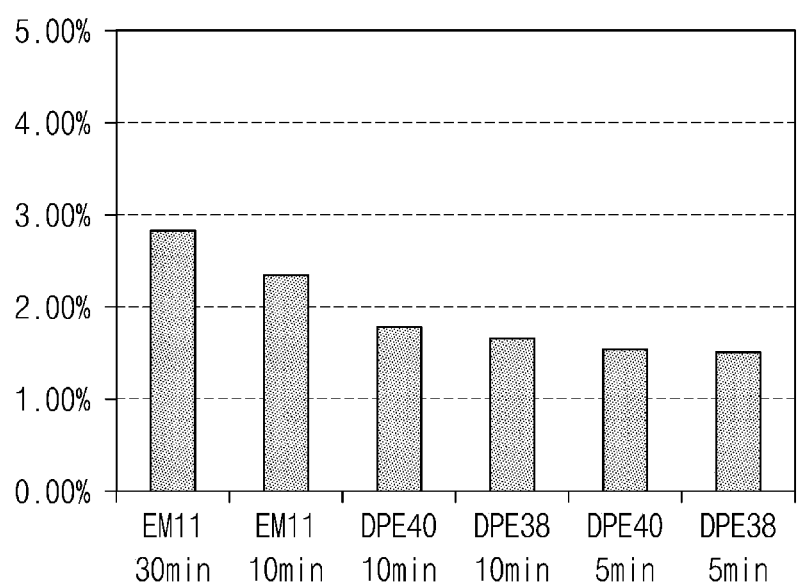
FIG. 13 is a graph schematically showing elution data of mixed solvents according to Comparative Examples and Examples.

For Comparative Example and Examples, an elution test for a hole transport compound was performed. FIG. 13 is a graph schematically showing elution data of mixed solvents according to Comparative Examples and Examples. FIG. 13 is a graph showing the elution data of each solvent for a hole transport compound having a δD of greater than about 20 and a δP of less than about 4 in terms of Hansen parameters.

FIG. 13 shows the time and amount of the hole transport compound eluted in each mixed solvent in %.

Referring to FIG. 13, Comparative Example 1 (EM11) exhibited an elution amount of about 2.0% or greater in case eluted both at about 30 minutes and about 10 minutes. On the other hand, in case that Example 1-1 (DPE40) and Example 1-2 (DPE38) were eluted at 30 minutes and 10 minutes, both showed an elution amount of less than 2.0%, and were not shown to have a significant increase in the elution amount compared to Comparative Example 1 even after lapse of the elution time. Accordingly, it is confirmed that orthogonality is secured between the hole transport region and the ink composition according to the disclosure. Example 1-1 has an IBB:DPE ratio of about 6:4, and Example 1-2 has an IBB:DPE ratio of about 6.2:3.8.

3. Evaluation of Light Emitting Diode Characteristics

Characteristics of light emitting diodes formed according to the method for manufacturing a light emitting diode of the disclosure were evaluated and shown in Table 3 below. In the light emitting diodes of Comparative Example and Examples, emission layers were formed of an ink composition including a mixed solvent and the same green light emitting material, and all were the same except for the type of the mixed solvent. In Comparative Example A, an emission layer was formed using an ink composition including the mixed solvent of Comparative Example 1 in Table 1. In Example A, an emission layer was formed using an ink composition including the mixed solvent of Example 1 in Table 1. In Example B, an emission layer was formed using an ink composition including the mixed solvent of Example 1-3 having an IBB:DPE ratio of about 7:3.

TABLE 3

| | Mixed solvent | Voltage (V) | CIE_x | CIE_y | λmax (Nm) | Luminance (cd/m$^2$) | Efficiency (Cd/A) | Full width of half maximum (nm) | lifespan (T95) |
|---|---|---|---|---|---|---|---|---|---|
| Comparative Example A | Comparative Example 1 | 6.3 | 0.317 | 0.663 | 538 | 3810 | 80.9 | 51 | 1080 |
| Example A | Example 1 | 6.2 | 0.316 | 0.664 | 538 | 3810 | 82.7 | 51 | 1340 |
| Example B | Example 1-3 | 6.2 | 0.310 | 0.669 | 537 | 3810 | 80.3 | 49 | — |

Referring to Table 3, it is seen that Example 1 and Example 1-3 achieved a lower voltage and higher efficiency than Comparative Example 1. It is seen that Example 1 exhibited longer life than Comparative Example 1.

4. Evaluation of Drying Rate

Figure 14:
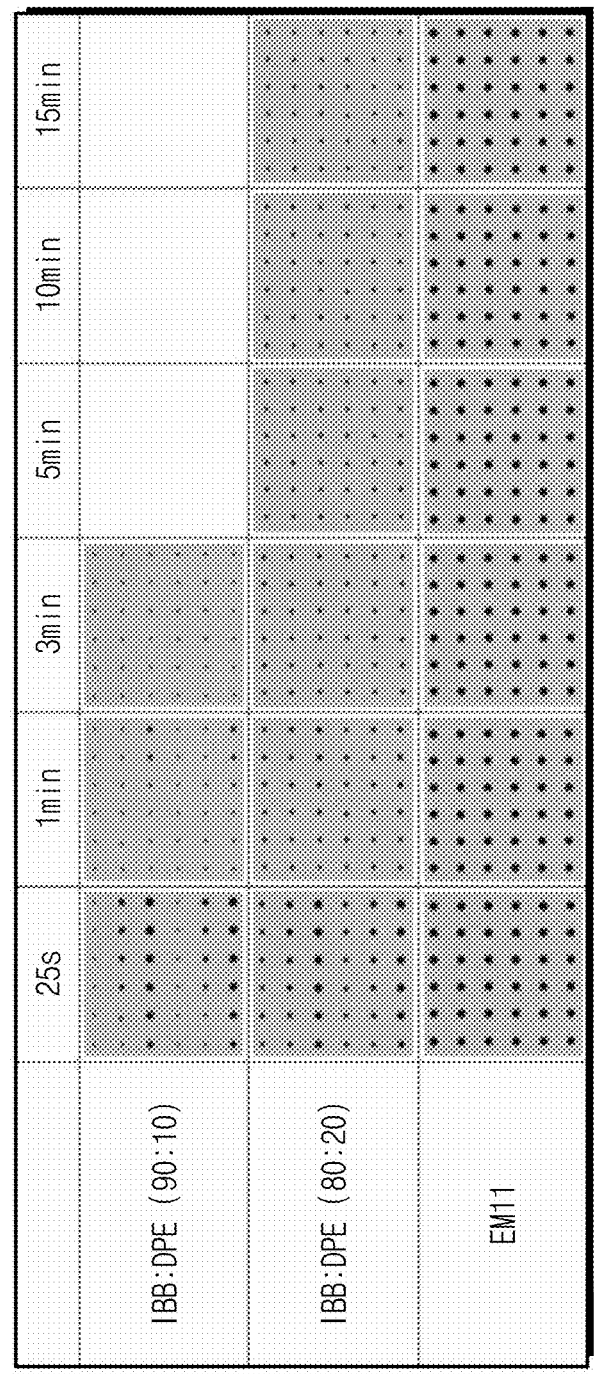
FIG. 14 is a schematic table comparing drying rates of solvents on a landing substrate.

Mixed inks of Comparative Example and Examples were landed onto the same substrate with a nozzle to form patterns. Thereafter, the drying rate was evaluated while performing drying at about 160° C. for about 15 minutes. FIG. 14 is a schematic table comparing drying rates of solvents on a landing substrate. FIG. 14 shows the results of evaluating drying rates for a mixed solvent (EM11) of Comparative Example 1 in which the ratio of EMB:IIBP is about 82:18, a mixed solvent of Example 1 in which the ratio of IBB: DPE is about 80:20, and a mixed solvent of Examples 1~4 in which the ratio of IBB: DPE is about 90:10.

Referring to FIG. 14, in Comparative Example 1, it is confirmed that the amount of the mixed solvent was not shown to be reduced after about 15 minutes. On the other hand, in Examples, it is clearly seen that the amount of the mixed solvent was shown to be reduced due to drying of the mixed solvent after about 1 minute.

An embodiment may provide an ink composition including a solvent having a controlled boiling point and vapor pressure, and a light emitting diode having increased efficiency.

An embodiment may provide a method for manufacturing a light emitting diode having increased process efficiency in forming an emission layer.

Although the disclosure has been described with reference to embodiments, it will be understood that the disclosure should not be limited to these embodiments but various changes and modifications can be made by those skilled in the art without departing from the spirit and scope of the disclosure.

Hence, the technical scope of the disclosure is not limited to the detailed descriptions in the specification, but should also include various changes and modifications.

What is claimed is:

1. An ink composition comprising:
   a mixed solvent including a first solvent and a second solvent; and
   a light emitting material, wherein
   the first solvent and the second solvent each have a vapor pressure of about $1 \times 10^{-4}$ or greater and a boiling point of about 270° C. or less, and
   the light emitting material includes a host compound, and a dopant compound.

2. The ink composition of claim 1, wherein the mixed solvent has a relative evaporation rate of about 30,000 or less.

3. The ink composition of claim 1, wherein the mixed solvent has a δD of about 20 or less and a δP of about 4 or greater in terms of Hansen parameters.

4. The ink composition of claim 1, wherein the first solvent is an aromatic solvent.

5. The ink composition of claim 4, wherein the second solvent is an ether-based solvent.

6. The ink composition of claim 5, wherein the first solvent and the second solvent are included at a ratio of about 8:2 to about 6:4.

7. The ink composition of claim 1, wherein the mixed solvent has an evaporation completion temperature of about 150° C. or less.

8. The ink composition of claim 1, wherein the light emitting material is included at an amount of about 0.5 to about 15 parts by weight with respect to 100 parts by weight of the mixed solvent.

9. A light emitting diode comprising:
   a first electrode;
   a hole transport region disposed on the first electrode;
   an emission layer disposed on the hole transport region and including:
      a mixed solvent including a first solvent and a second solvent, and a light emitting material; and a second electrode disposed on the emission layer, wherein the first solvent and the second solvent each have a vapor pressure of about $1\times10^{-4}$ or greater and a boiling point of about 270° C. or less, and the light emitting material includes a host compound and a dopant compound.

10. The light emitting diode of claim 9, wherein the mixed solvent has a relative evaporation rate of about 30,000 or less.

11. The light emitting diode of claim 9, wherein the mixed solvent has a δD of about 20 or less and a δP of about 4 or greater in terms of Hansen parameters.

12. The light emitting diode of claim 11, wherein the hole transport region comprises a hole transport compound, and the hole transport compound has a δD of greater than about 20 and a δP of less than about 4 in terms of Hansen parameters.

13. The light emitting diode of claim 9, further comprising:

a capping layer disposed on the second electrode, wherein the capping layer has a refractive index of about 1.6 or greater.

* * * * *